(12) United States Patent
Yoon et al.

(10) Patent No.: US 9,956,740 B2
(45) Date of Patent: May 1, 2018

(54) BOWL-SHAPED STRUCTURE, METHOD FOR MANUFACTURING SAME, AND BOWL ARRAY

(75) Inventors: Kyung Byung Yoon, Seoul (KR); Hyun Sung Kim, Seoul (KR)

(73) Assignee: Sogang University Research Foundation, Seoul (KR)

( * ) Notice: Subject to any disclaimer, the term of this patent is extended or adjusted under 35 U.S.C. 154(b) by 1103 days.

(21) Appl. No.: 14/111,468

(22) PCT Filed: Apr. 10, 2012

(86) PCT No.: PCT/KR2012/002735
§ 371 (c)(1),
(2), (4) Date: Dec. 23, 2013

(87) PCT Pub. No.: WO2012/141484
PCT Pub. Date: Oct. 18, 2012

(65) Prior Publication Data
US 2014/0141184 A1    May 22, 2014

(30) Foreign Application Priority Data

Apr. 11, 2011 (KR) .................. 10-2011-0033418

(51) Int. Cl.
*C23C 14/22* (2006.01)
*B32B 3/30* (2006.01)
(Continued)

(52) U.S. Cl.
CPC ............ *B32B 3/30* (2013.01); *B81C 1/00103* (2013.01); *B81C 1/00373* (2013.01);
(Continued)

(58) Field of Classification Search
CPC .... B81C 1/00373; B81C 1/00103; B32B 3/30
See application file for complete search history.

(56) References Cited

U.S. PATENT DOCUMENTS 6,487,002 B1 * 11/2002 Biegelsen .............. G02B 5/128
359/296
2005/0224779 A1   10/2005 Wang et al.
(Continued)

FOREIGN PATENT DOCUMENTS

KR    10-2009-0076568    7/2009
KR    10-2011-0007814    1/2011

OTHER PUBLICATIONS

Chun et al "Engineering Low-Aspect Ratio Carbon Nanostructures: Nanocups, Nanorings, and Nanocontainers" ACS Nano vol. 3 (5) p. 1274-1278 (May 1, 2009).*
(Continued)

*Primary Examiner* — Nathan H Empie
(74) *Attorney, Agent, or Firm* — Greer Burns & Crain Ltd.

(57) ABSTRACT

The present invention provides a method for manufacturing a bowl-shaped structure, a bowl-shaped structure manufactured thereby, and a bowl array using the bowl-shaped structure, wherein the method for manufacturing the bowl-shaped structure comprises the following steps: putting into contact a first substrate, on which a particle alignment layer is formed, and a second substrate so as to transfer the particle alignment layer to the second substrate; forming a particle-thin film complex by coating the particle alignment layer that is transferred on the second substrate with a thin film formation substance; removing a portion of the thin film formation substance from the complex to expose particles, and then removing the exposed particles to form a template having a hole; and forming the bowl-shaped structure by coating a first substance on the surface of the hole of the template and then removing the template.

14 Claims, 28 Drawing Sheets

(51) Int. Cl.
*B81C 1/00* (2006.01)
*C23C 14/08* (2006.01)

(52) U.S. Cl.
CPC ............ *C23C 14/083* (2013.01); *C23C 14/22* (2013.01); *Y10T 428/13* (2015.01)

(56) References Cited

U.S. PATENT DOCUMENTS

| | | |
|---|---|---|
| 2010/0245978 A1 | 9/2010 | Baumberg et al. |
| 2011/0192988 A1* | 8/2011 | Feng .................. H01J 1/48 250/440.11 |

OTHER PUBLICATIONS

Wang et al "Large-Scale Fabrication of Ordered Nanobowl Arrays" NanoLetters 2004 vol. 4 (11) 2223-2226 (Sep. 30, 2004).*
Ye et al "Fabrication, Characterization, and Optical Properties of Gold Nanobowl Submonolayer Structures" Langmuir 2009, 25, 1822-1827 (Jan. 6, 2009).*
International Search Report issued in International App. No. PCT/KR2012/002735.

* cited by examiner

BOWL-SHAPED STRUCTURE, METHOD FOR MANUFACTURING SAME, AND BOWL ARRAY

TECHNICAL FIELD

The present disclosure relates to a bowl-typed structure, a preparing method of the bowl-typed structure, and a bowl array including a plurality of the bowl-typed structures, which are regularly aligned with a constant interval.

BACKGROUND ART

Aligning uniform structures having a size of a few nanometers to hundreds of micrometers on a substrate is a very important area of the modern science and technologies. An array of the uniform structures can be applied to various fields such as memory devices, optical devices, photoelectronic devices, various sensors (sensors for chemical, biochemical and medical molecule detection which use antigen-antibody, DNA-DNA and protein-protein reactions, pH sensors, and solvent detection sensors), photosynthesis, etc.

In order to use the array in the various fields described above, each of the structures forming the array should have no significant defect of a few millimeters or more and assure perfect control with respect to crystal orientation and lattice symmetry. Meanwhile, from the commercial point of view, preparation of the array should be simply and quickly performed, and each of the structures forming the array should be reproducible.

However, the array of the uniform structures formed by conventional preparing methods has a problem because controlling the structure and the orientation is difficult, and the structure itself has many defects.

DISCLOSURE OF THE INVENTION

Problems to Be Solved by the Invention

Accordingly, the present disclosure provides a bowl-typed structure prepared by using a template including holes formed by using an alignment layer of particles, a preparing method of the bowl-typed structure, and a bowl array including a plurality of the bowl-typed structures, which are regularly aligned with a constant interval.

However, the problems sought to be solved by the present disclosure may not be limited to those described above. Other problems, which are sought to be solved by the present disclosure but are not described herein, can be clearly understood by one of ordinary skill in the art from the descriptions below.

Means for Solving the Problems

In order to solve the foregoing technical problems, the preparing method of a bowl-typed structure in accordance with one aspect of the present disclosure includes: contacting a first substrate on which an alignment layer of particles is formed, with a second substrate to transfer the alignment layer of the particles to the second substrate; coating the alignment layer of the particles transferred onto the second substrate with a thin film-forming material to form a particles-thin film composite; removing a portion of the thin film-forming material from the composite to expose the particles and then removing the exposed particles to form a template including holes; and coating the surface of the holes of the template with a first material and then removing the template to form a bowl-typed structures.

In an illustrative embodiment, the first material may include a member selected from the group consisting of a metal, a semiconductor, a metal oxide, an alloy, and combinations thereof, but it may not be limited thereto.

In an illustrative embodiment, the coating of the surface of the holes of the template with the first material may be performed by sputtering, thermal evaporation, pulsed laser deposition (PLD), atomic layer deposition (ALD), ion-assisted deposition (IAD), or self-assembly, but it may not be limited thereto.

In an illustrative embodiment, the preparing method of a bowl-typed structure may further include coating a second material once or more on the first material coated to the surface of the holes, but it may not be limited thereto. In an illustrative embodiment, the second material may include a member selected from the group consisting of a metal, a semiconductor, a metal oxide, an alloy, and combinations thereof, but it may not be limited thereto. The first and second materials may be identical to or different from each other.

In an illustrative embodiment, the coating of the first material coated on the surface of the holes with the second material may be performed by sputtering, thermal evaporation, pulsed laser deposition (PLD), atomic layer deposition (ALD), ion-assisted deposition (IAD), or self-assembly, but it may not be limited thereto.

In an illustrative embodiment, the first substrate may include a first intaglio pattern or a first embossed pattern formed on a surface thereof, but it may not be limited thereto. For example, the first intaglio pattern or the first embossed pattern may be carved directly on the substrate itself through lithography, a laser beam, or etching, etc., formed by a positive or negative photoresist, formed by laser ablation after coating with a sacrificial layer, or formed by an inkjet printing method, but it may not be limited thereto.

For example, a shape of pores formed by the first intaglio pattern or a shape of a cross-section of the first embossed pattern may include a circle, polygons such as a triangle, a square, a pentagon, a hexagon, a heptagon, an octagon, a nonagon, a decagon, a trapezoid, a diamond and a parallelogram, an oval, a half moon shape, a crescent moon shape, a complex figures such as a flower shape and a star shape, and various geometrical shapes such as a linear shape and a curved trench shape, and etc., but it may not be limited thereto. According to the present disclosure, it is possible to insert particles into almost all pores to perfectly align the particles, irrespective of the shape of the pores formed by the first intaglio pattern or the first embossed pattern.

In an illustrative embodiment, the shape of the pores formed by the first intaglio pattern or the first embossed pattern formed on the first substrate may include a shape corresponding to a shape of a certain portion of the particles to be inserted into the pores in order to control the orientation of the particles, but it may not be limited thereto.

In an illustrative embodiment, an adhesive layer may be formed on the surface of each of the second substrate and/or the first substrate, but it may not be limited thereto. For example, the adhesive layer may include a compound selected from the group consisting of (i) a compound including a —$NH_2$ group, (ii) a compound including a —SH group, (iii) a compound including a —OH group, (iv) a polymer electrolyte, (v) an adhesive polymer, and (vi) a photoresist or combinations thereof, but it may not be limited thereto. For example, the adhesive layer may include polystyrene, polyethylene imine (PEI), polyacrylamide (PAM), poly-DADMAC (diallydimethyl ammonium chloride), polyethylene oxide (PEO) or combinations thereof, but it may not be limited thereto.

In an illustrative embodiment, the template may include a porous thin film structure including regularly aligned holes, but it may not be limited thereto.

In an illustrative embodiment, a size of the particles may be from about 10 nm to about 100 μm, but it may not be limited thereto. A size of the particles may be in a nanometer to micrometer range. For example, a size of the particles may be from about 10 nm to about 100 μm, or from about 10 nm to about 50 μm, or from about 10 nm to about 10 μm, or from about 10 nm to about 1 μm, or from about 50 nm to about 100 μm, or from about 100 nm to about 100 μm, or from about 1 μm to 100 μm, but it may not be limited thereto.

In an illustrative embodiment, a thickness of a coating layer formed by the coating with the first material may be from about 1 nm to about 10 μm, but it may not be limited thereto. For example, a thickness of the coating layer may be from about 1 nm to about 10 μm, or from about nm to about 1 μm, or from about 1 nm to about 500 nm, or from about 1 nm to about 300 nm, or from about 1 nm to about 200 nm, or from 1 nm to about 100 nm, or from about 5 nm to about 10 μm, or from about 5 nm to about 1 μm, or from about 5 nm to about 500 nm, or from 5 nm to about 300 nm, or from about 5 nm to about 200 nm, from about 5 nm to about 100 nm, or from about 50 nm to about 10 μm, or from about 50 nm to about 1 μm, or from about 50 nm to about 500 nm, or from about 50 nm to about 300 nm, or from about 50 nm to about 200 nm, but it may not be limited thereto.

In an illustrative embodiment, the alignment layer of the particles may be formed by putting a plurality of the particles on the first substrate and then applying a physical pressure to the particles, but it may not be limited thereto. In an illustrative embodiment, the physical pressure may be applied by rubbing or pressing against the substrate, but it may not be limited thereto.

In an illustrative embodiment, the particles may include an organic material, an inorganic material, or combinations thereof. The particles including an organic material, an inorganic material, or combinations thereof may be particles formed by using a proper material selected from materials known in the art of the present disclosure. For example, the particles may include a member selected from the group consisting of an organic polymer, an inorganic polymer, an inorganic oxide, or other various types of inorganic compounds, a metal, a magnetic substance, a semiconductor, a biomaterial, and combinations thereof, but it may not be limited thereto.

Non-limiting examples for the organic polymer may include polystyrene, polymethylmethacrylate (PMMA), polyacrylate, polyalphamethylstyrene, polybenzylmethacrylate, bolyphenylmethacrylate, polydiphenylmethacrylate, polycyclohexylmethacrylate, a styrene-acrylonitrile copolymer, a styrene-methylmethacrylate copolymer, or combinations thereof, but it may not be limited thereto.

Non-limiting examples for an inorganic material such as the inorganic polymer or the inorganic compound may include inorganic oxides such as a titanium oxide, a zinc oxide, a cerium oxide, a tin oxide, a thallium oxide, a barium oxide, an aluminum oxide, an yttrium oxide, a zirconium oxide, a copper oxide and a nickel oxide; and inorganic polymers or others such as silica, a silicone polymer, various known zeolites, a layered double hydroxide (LDH), and other various inorganic polymers known in the art of the present disclosure, but it may not be limited thereto.

Non-limiting examples for the metal may include gold, silver, copper, platinum, aluminum, zinc, cerium, thallium, barium, yttrium, zirconium, tin, titanium, cadmium, iron, or alloys thereof, but it may not be limited thereto.

The semiconductor may include an organic semiconductor or an inorganic semiconductor, but it may not be limited thereto. The organic semiconductor or the inorganic semiconductor may be properly selected from ones known in the art of the present disclosure. Non-limiting examples for the semiconductor may include a single element semiconductor (e.g., Si and Ge) and a compound semiconductor (e.g., compound semiconductors such as AlP, AlAs, AlSb, GaN, GaP, GaAs, GaSb, InP, InAs and InSb, and other various known compound semiconductors), but it may not be limited thereto.

In an illustrative embodiment, the particles may include $SiO_2$, $TiO_2$, ITO (indium tin oxide), $Al_2O_3$; and materials selected from crystalline and non-crystalline chalcogenides of binary and multicomponent main group metal and transition metal such as sulfides, celenide types and telluride types, but it may not be limited thereto.

In an illustrative embodiment, the particles may be of a simple particle or a core/shell shape, but it may not be limited thereto. For example, the particles may be of a core/shell shape having a core containing at least one material selected from the examples for the materials that can be contained in the particles, and a shell containing at least one material selected from the examples for the materials that can be contained in the particles, but it may not be limited thereto. If the particles are of the core/shell shape, the particles can have at least one core and at least one shell. For example, the particles may be of various shapes such as a core/first shell/second shell shape or a first core/second core/first shell/second shell, but it may not be limited thereto.

In an illustrative embodiment, the particles may include a fluorescent core material and shell surrounding the core including various materials; a material, in which two or more materials are multilayered like an onion; a fluorescent material, in which organic, inorganic or organic-inorganic fluorescent molecules are regularly and irregularly distributed in organic and inorganic particles; and particles having a magnetic, diamagnetic, Paramagnetic, ferrielectric, ferroelectric, superconductive, conductive, semiconductor or nonconductor property, but it may not be limited thereto.

In an illustrative embodiment, non-limiting examples for the biomaterial forming the particles may include proteins, peptides, DNAs, RNAs, polysaccharides, oligosaccharides, lipids, cells, and composites thereof, but it may not be limited thereto.

In an illustrative embodiment, an aspect ratio, which represents the ratio of a diameter and a depth of the bowl-typed structure, may be from about 0.1 to about 10, but it may not be limited thereto.

In an illustrative embodiment, the bowl-typed structure may include a plurality of the bowl-typed structures, and each of the plurality of the bowl-typed structures may be regularly aligned with a constant interval. However, the present disclosure may not be limited thereto.

In an illustrative embodiment, the preparing method of the bowl-typed structure may further include separating the temperate from the second substrate, but it may not be limited thereto. In this case, the template separated from the second substrate may be transferred onto a substrate having larger holes than the holes.

In an illustrative embodiment, for the first and/or second substrate, any solid-phase substrate known in the art of the present disclosure can be used. For example, the first and/or second substrate may include glass, a fused silica wafer, a silicone wafer, or a substrate coated with a photoresist, but it may not be limited thereto.

Another aspect of the present disclosure provides a bowl-typed structure prepared by the above-described preparing method of the present disclosure.

Another aspect of the present disclosure provides a bowl array including a plurality of bowl-typed structures, which are prepared by the above-described preparing method of the present disclosure and regularly aligned with a constant interval.

Descriptions of the bowl-typed structure and the bowl array according to the present disclosure include all the above technical descriptions of the preparing method of the bowl-typed structure. For convenience, overlapping descriptions in this regard are omitted.

Effect of the Invention

The present disclosure can form a template including holes by using a method of rubbing particles and prepare a bowl-typed structure by using the template. Through the simple process, the present disclosure can prepare a bowl array, in which a plurality of the bowl-typed structures are regularly aligned with a constant interval. In addition, the present disclosure can control a size of the bowl-typed structure to be in various ranges of tens of nanometers to a few hundreds of micrometers by controlling a size of the particles.

BEST MODE FOR CARRYING OUT THE INVENTION

Figure 1:
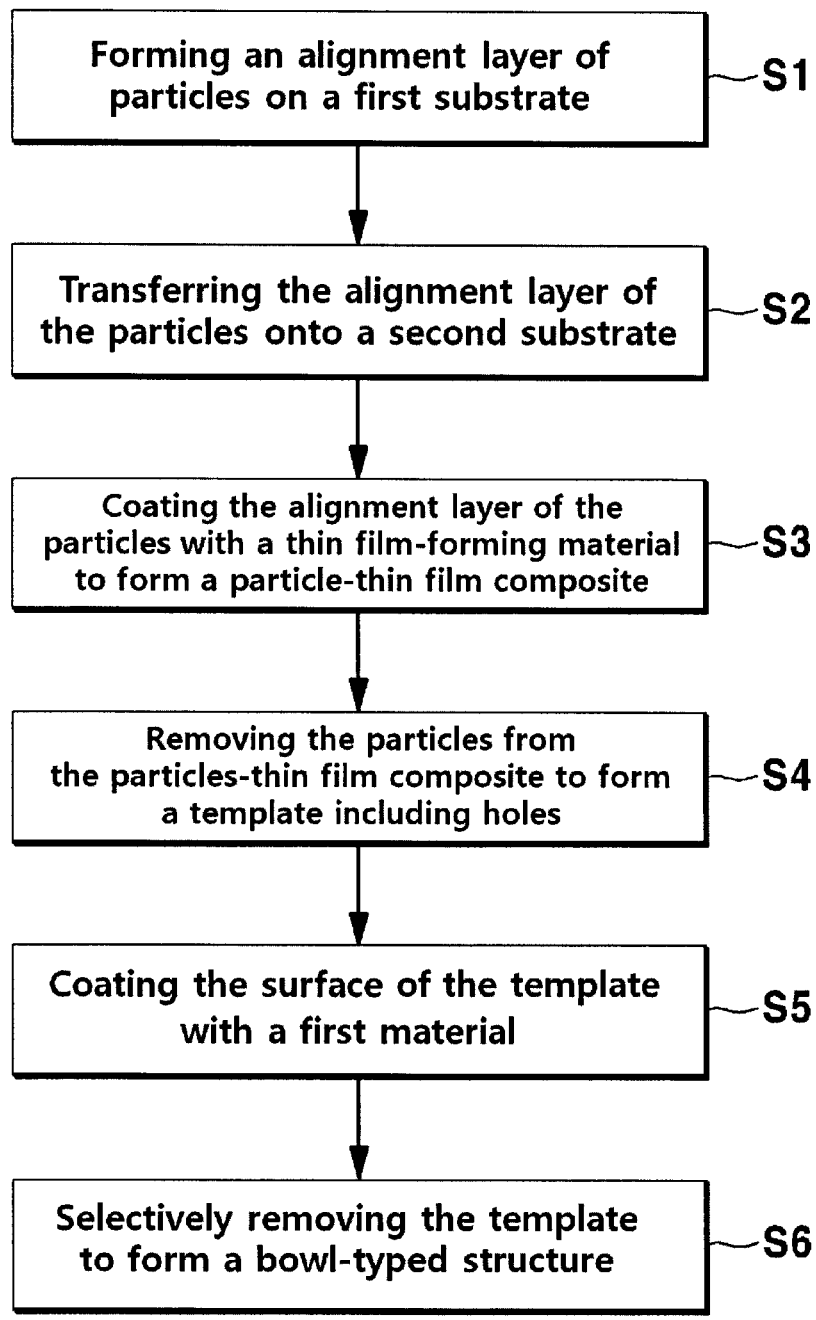
FIG. 1 is a flow chart for explanation of a process for preparing a bowl-typed structure in accordance with an illustrative embodiment of the present disclosure.
Figure 2:
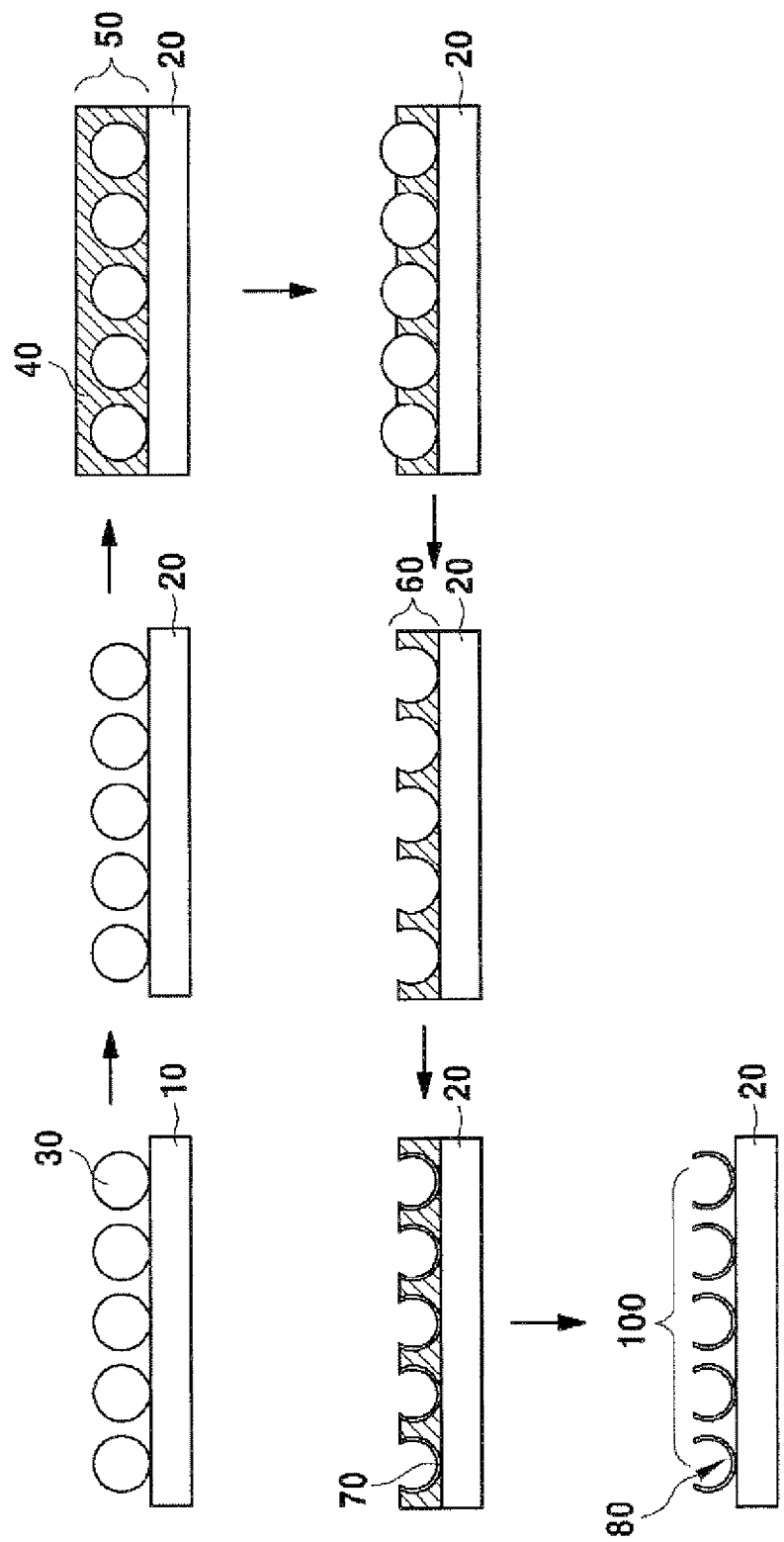
FIG. 2 is a flow chart for explanation of a process for preparing a bowl-typed structure in accordance with an illustrative embodiment of the present disclosure.

Hereinafter, illustrative embodiments and examples of the present disclosure will be described in detail with reference to the accompanying drawings so that inventive concept may be readily implemented by those skilled in the art.

However, it is to be noted that the present disclosure may not be limited to the illustrative embodiments and the examples but can be realized in various other ways. In the drawings, parts irrelevant to the description are omitted for the simplicity of explanation, and like reference numerals denote like parts through the whole document.

Throughout the whole document, the term "comprises or includes" and/or "comprising or including" used in the document means that one or more other components, steps, operations, and/or the existence or addition of elements are not excluded in addition to the described components, steps, operations and/or elements.

The terms "about or approximately" or "substantially" used in the document are intended to have meanings close to numerical values or ranges specified with an allowable error and intended to prevent accurate or absolute numerical values disclosed for understanding of the present invention from being illegally or unfairly used by any unconscionable third party. Throughout the whole document, the term "step of" does not mean "step for."

The "bowl-typed structure" used in this document means a structure including a lower portion, an outer peripheral portion extending upward and outward in a straight line and/or arc shape from the lower portion, and an opening upper portion formed by the outer peripheral portion.

The term "holes" used in this document mean pores in various shapes with at least part thereof having an opening.

As shown in FIG. 1, the preparing method of the bowl-typed structure of the present disclosure includes: forming an alignment layer of particles on a first substrate (S1); transferring the alignment layer of the particles onto a second substrate (S2); coating the alignment layer of the particles on the second substrate with a thin film-forming material to form a particles-thin film composite (S3); removing the particles from the particles-thin film composite to form a template including holes (S4); coating the surface of the holes of the template with a first material (S5); and selectively removing the template from the template coated with the first material to form a bowl-typed structure (S6).

Hereinafter, the preparing method of the bowl-typed structure of the present disclosure will be described in more detail with reference to FIGS. 1 to 4.

First, an alignment layer of particles (30) is formed on a first substrate 10 (S1). Conventionally, in order to form an alignment layer of particles, there has been used a method of dispersing particles on a solvent, and then, forming an alignment layer of particles through self-assembly of the particles. Unlike the conventional technology, the present disclosure applies a physical pressure such as rubbing particles to align the particles on the substrate. Accordingly, the method of forming the alignment layer of the particles in the present disclosure does not require precise control of a temperature and moisture, which is necessary for self-assembly of particles in a solvent. Further, since the present disclosure moves the particles fast in a desired direction on the substrate surface, it is possible to suppress the movement of the particles on the substrate from being affected by surface properties (e.g., hydrophobicity, charge, and roughness). In addition, if a substrate is patterned, the conventional technology, which uses particles dispersed in a solvent, has a problem in that since the particles are not easily inserted into micropores formed by the pattern due to the capillary phenomenon of the solvent, insertion of the particles is irregular. Unlike the conventional technology, since the present disclosure applies a physical pressure to the particles to directly insert the particles into micropores, it is possible to insert the particles into all pores. Furthermore, the aligning method of the particles in the present disclosure allows greater tolerance than that of the alignment through self-assembly with respect to a size and a shape of the particles in the process of aligning the particles on a patterned substrate.

The rubbing refers to simply applying a physical pressure onto the particles to form physical or chemical bond between the particles and the substrate. The chemical bond may include hydrogen bond, ionic bond, covalent bond, coordination bond or van der Waals bond, and preferably, ionic bond or hydrogen bond. The rubbing may be performed by using a bare hand, a rubbing instrument or a rubbing machinery device to apply a pressure onto the particles, but it may not be limited thereto.

Figure 3:
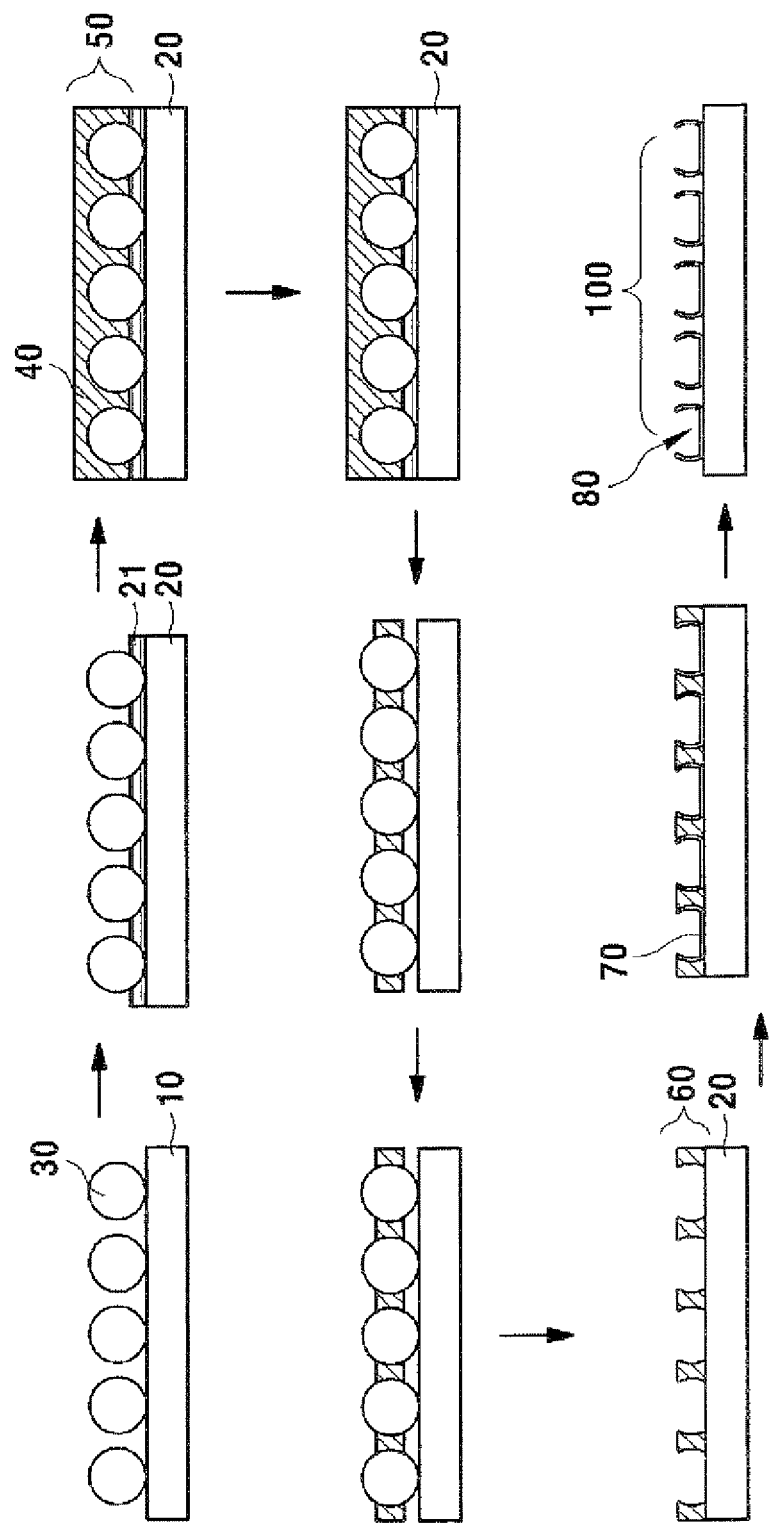
FIG. 3 is a flow chart for explanation of a process for preparing a bowl-typed structure in accordance with another embodiment of the present disclosure.
Figure 4:
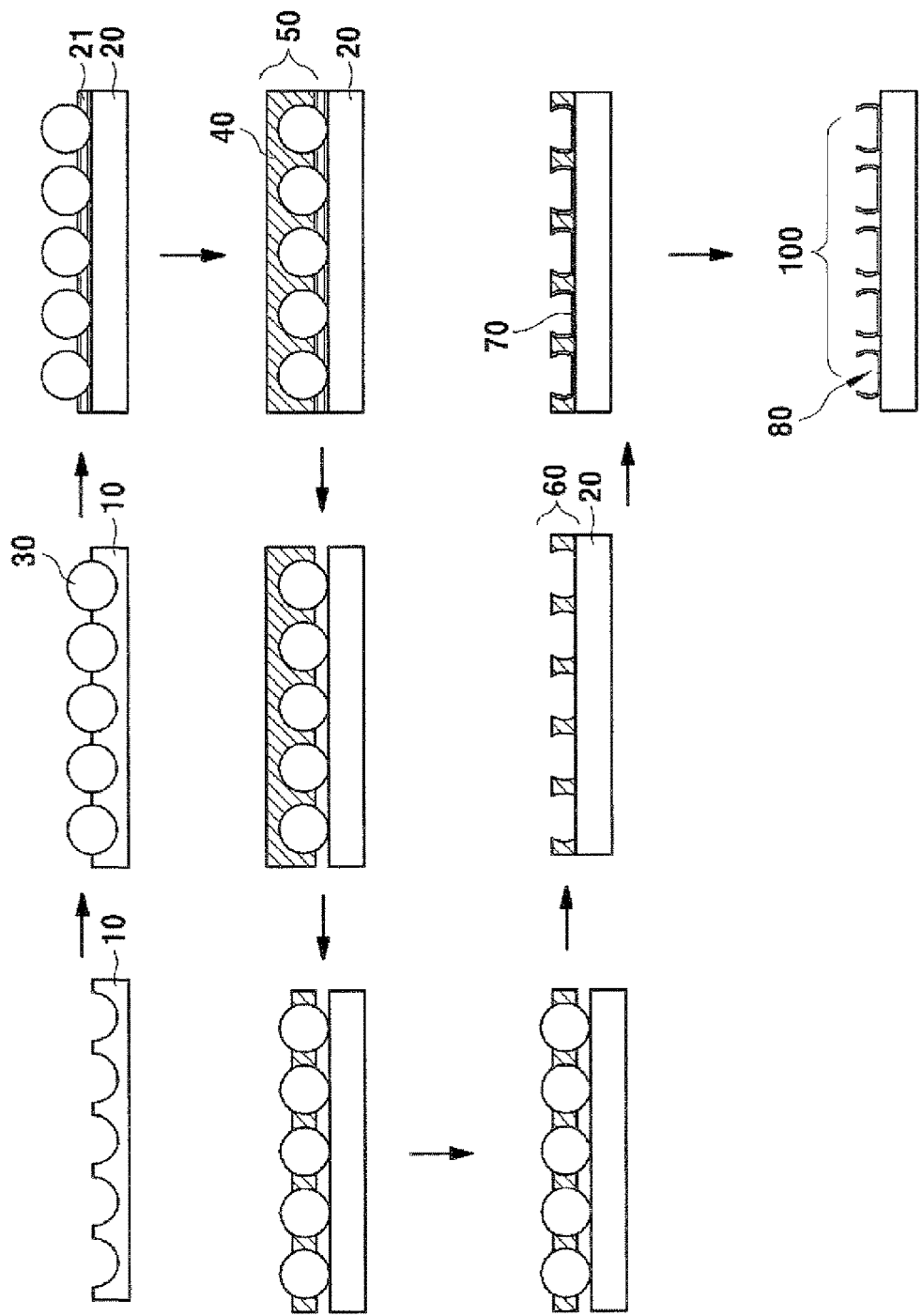
FIG. 4 a flow chart for explanation of a process for preparing a bowl-typed structure in accordance with an illustrative embodiment of the present disclosure.
Figure 5A:
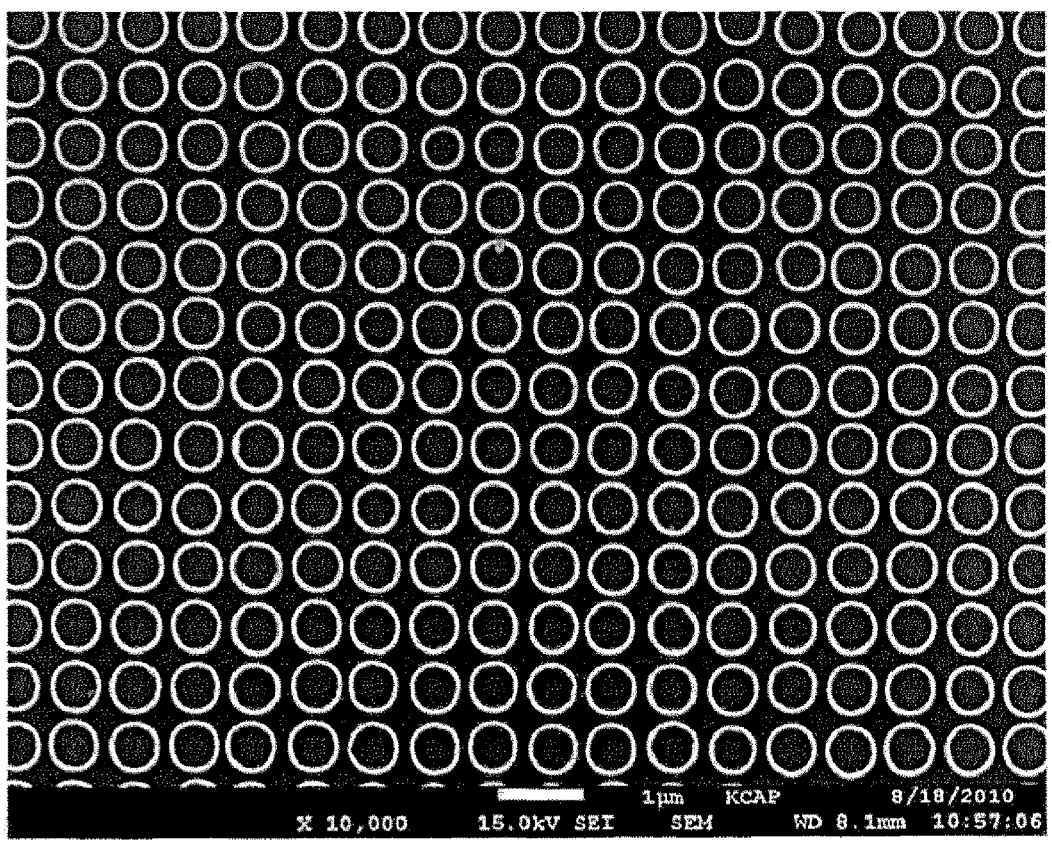
FIG. 5 is a photograph of a $WO_3$ bowl array observed by using a transmission electrode microscope (TEM) in accordance with an example of the present disclosure.
Figure 5B:
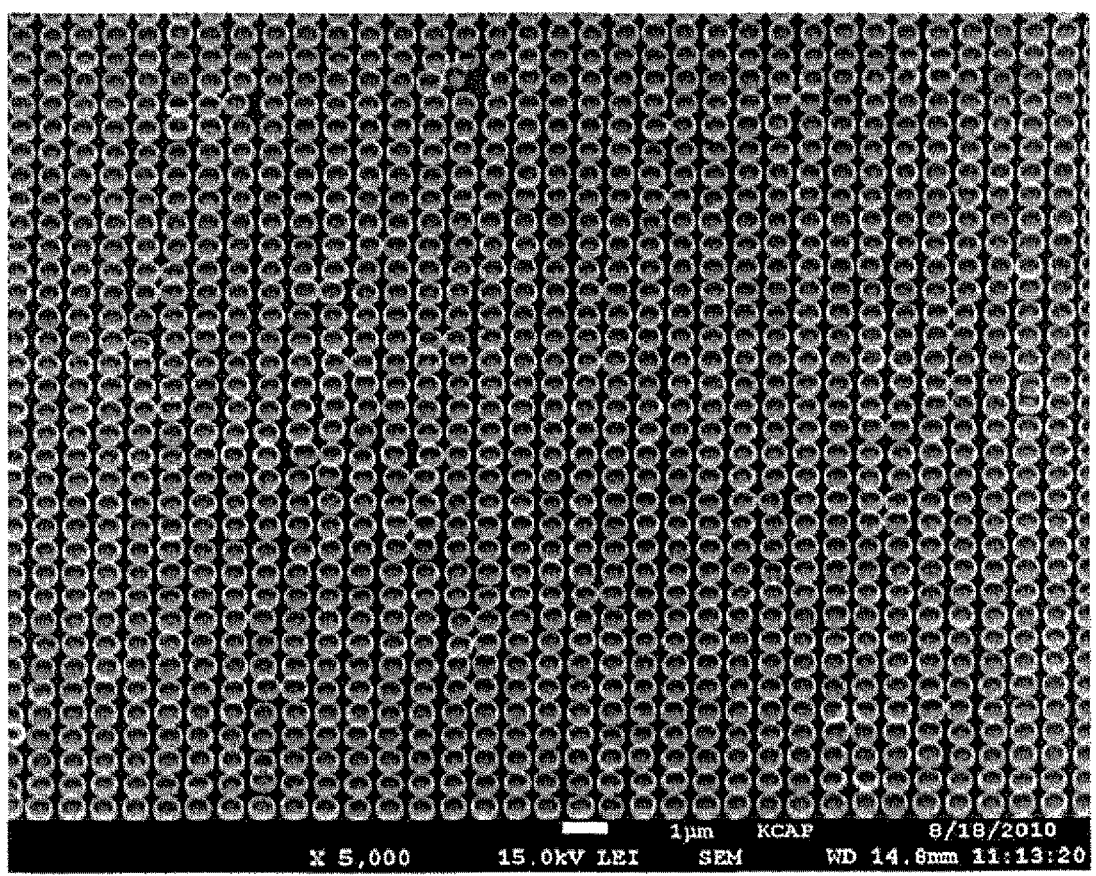
Figure 5C:
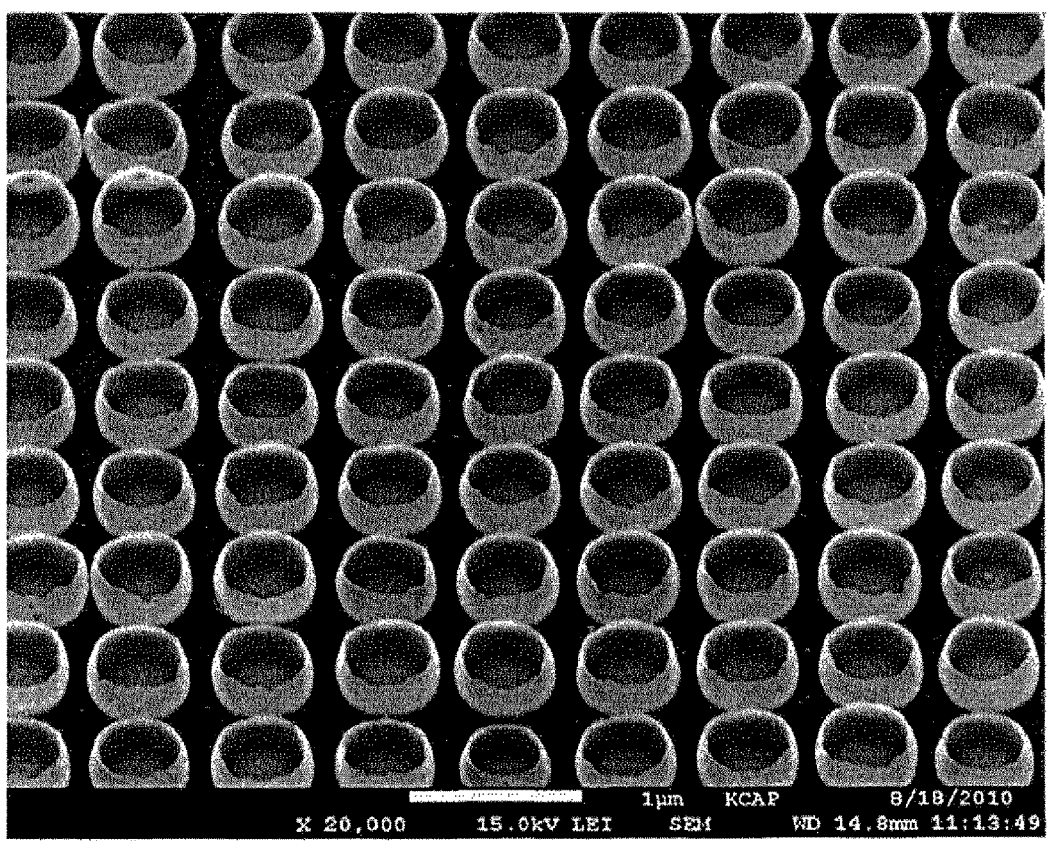
Figure 5D:
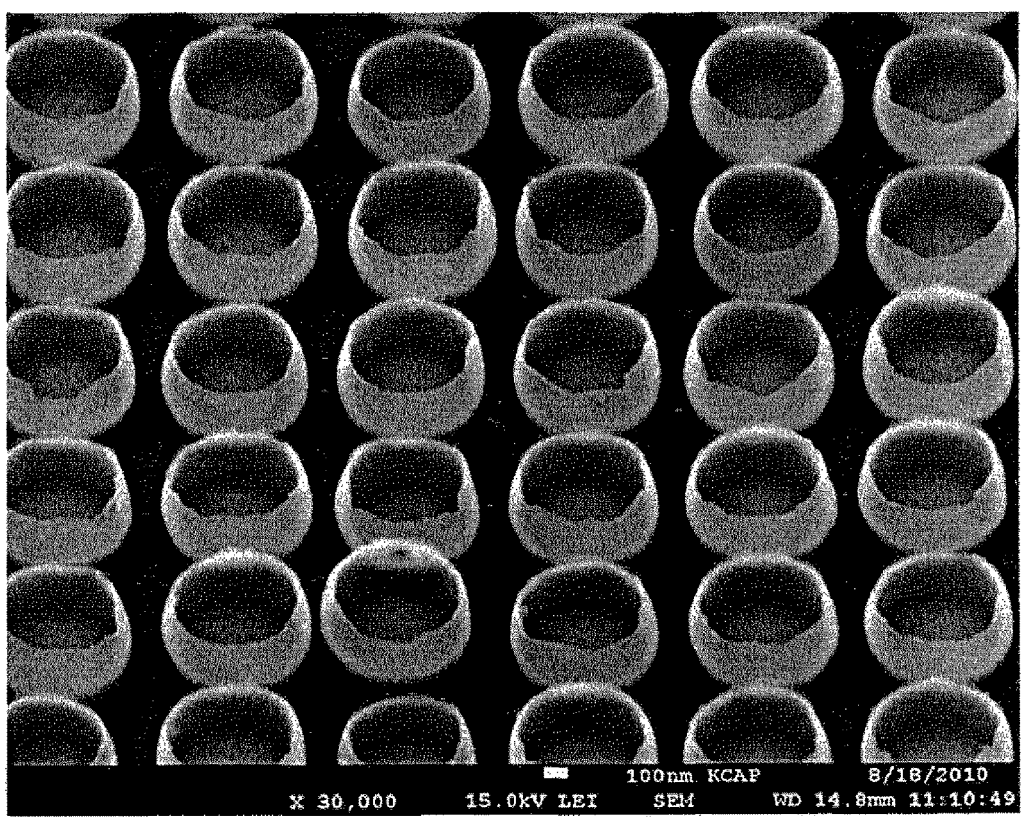
Figure 6A:
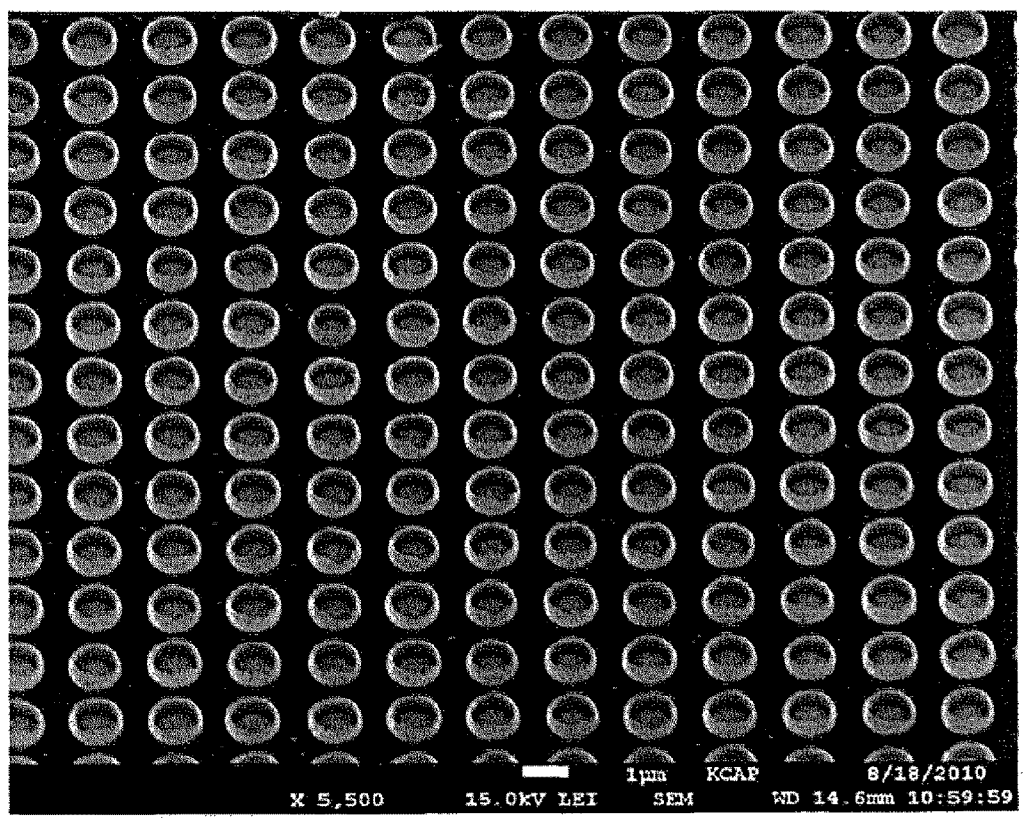
FIG. 6 is a photograph of a CdS bowl array observed by using a transmission electrode microscope (TEM) in accordance with an example of the present disclosure.
Figure 6B:
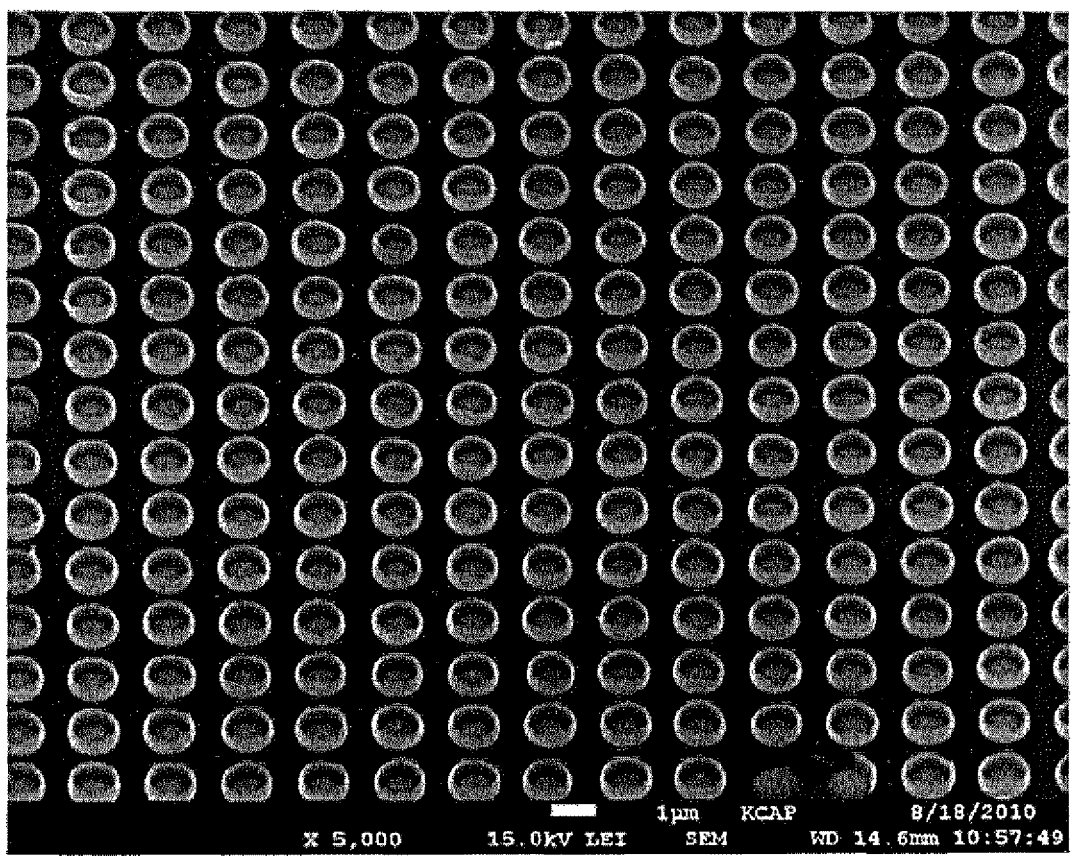
Figure 6C:
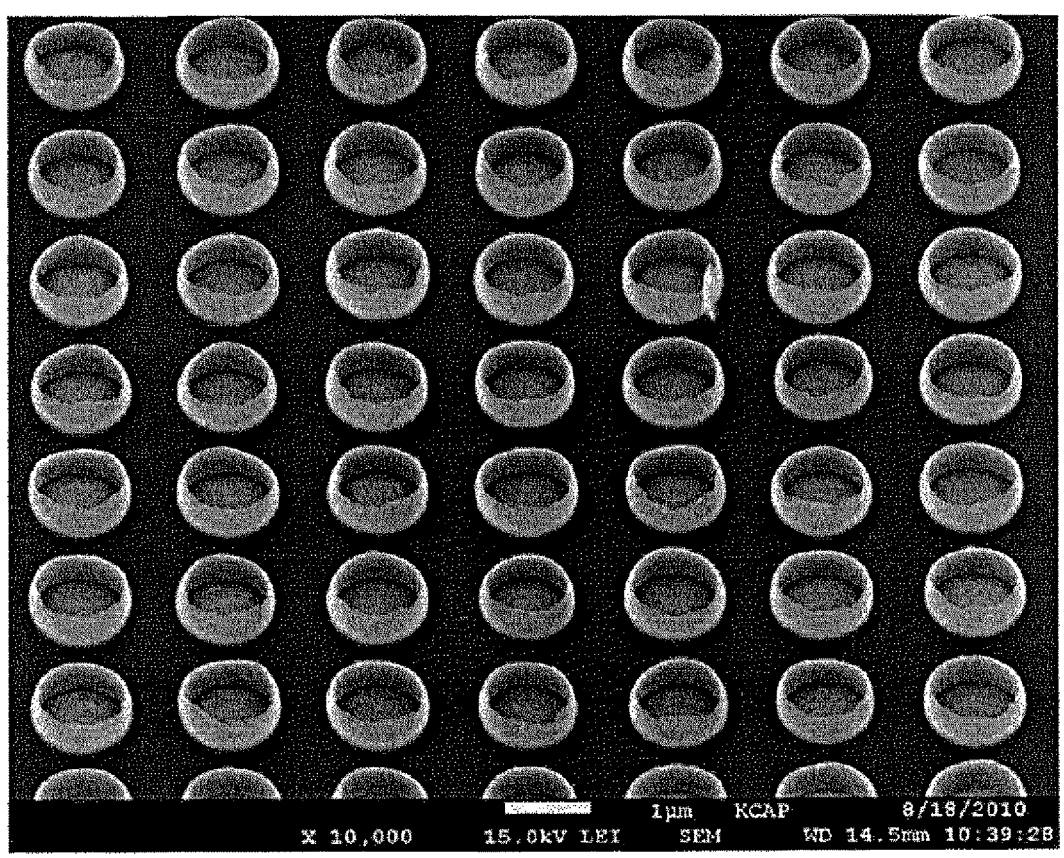
Figure 6D:
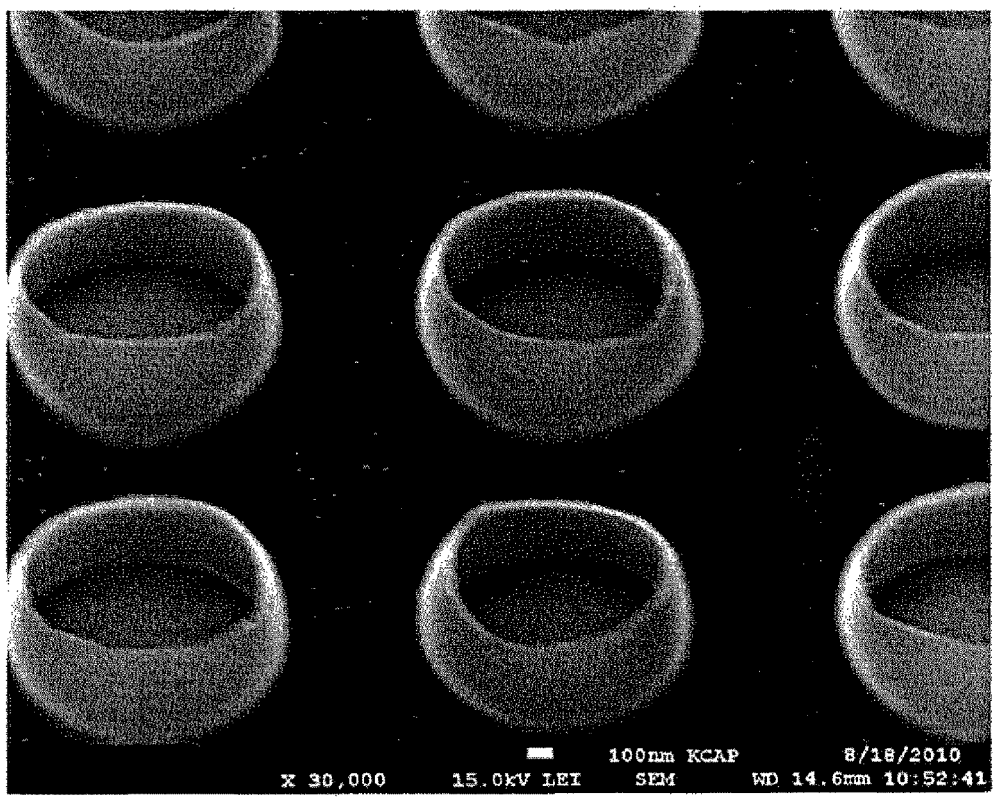
Figure 7A:
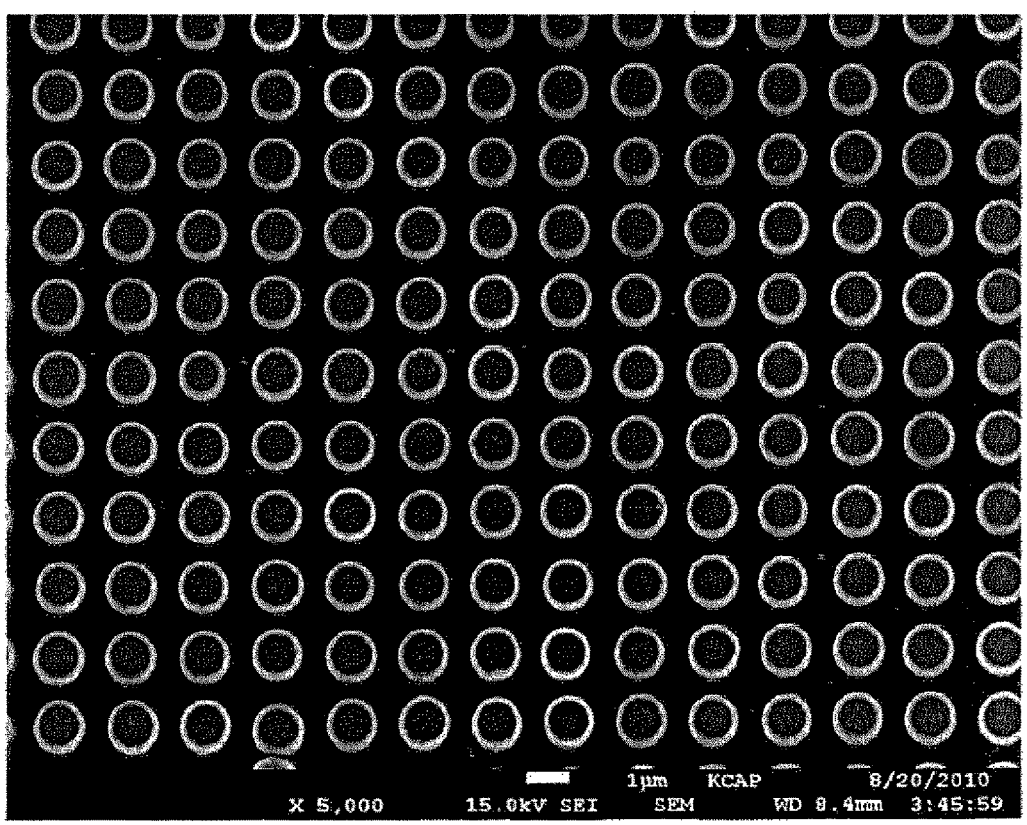
FIG. 7 is a photograph of a $BiVO_4$ bowl array observed by using a transmission electrode microscope (TEM) in accordance with an example of the present disclosure.
Figure 7B:
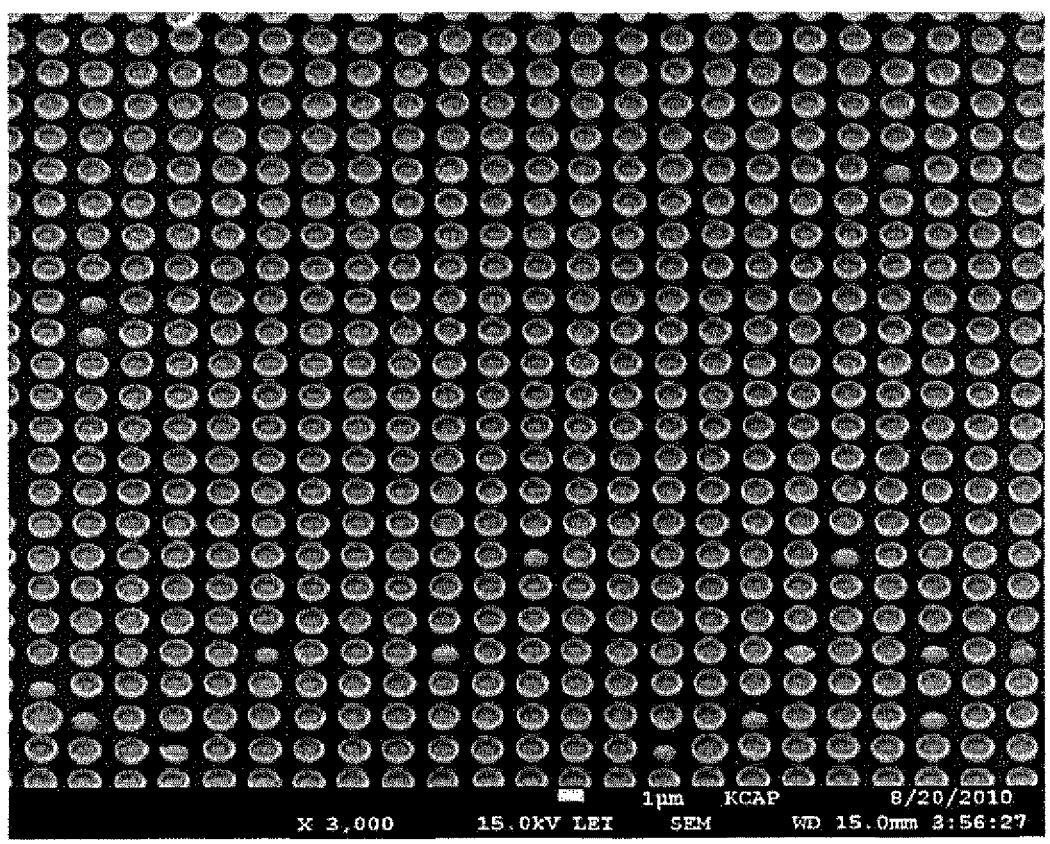
Figure 7C:
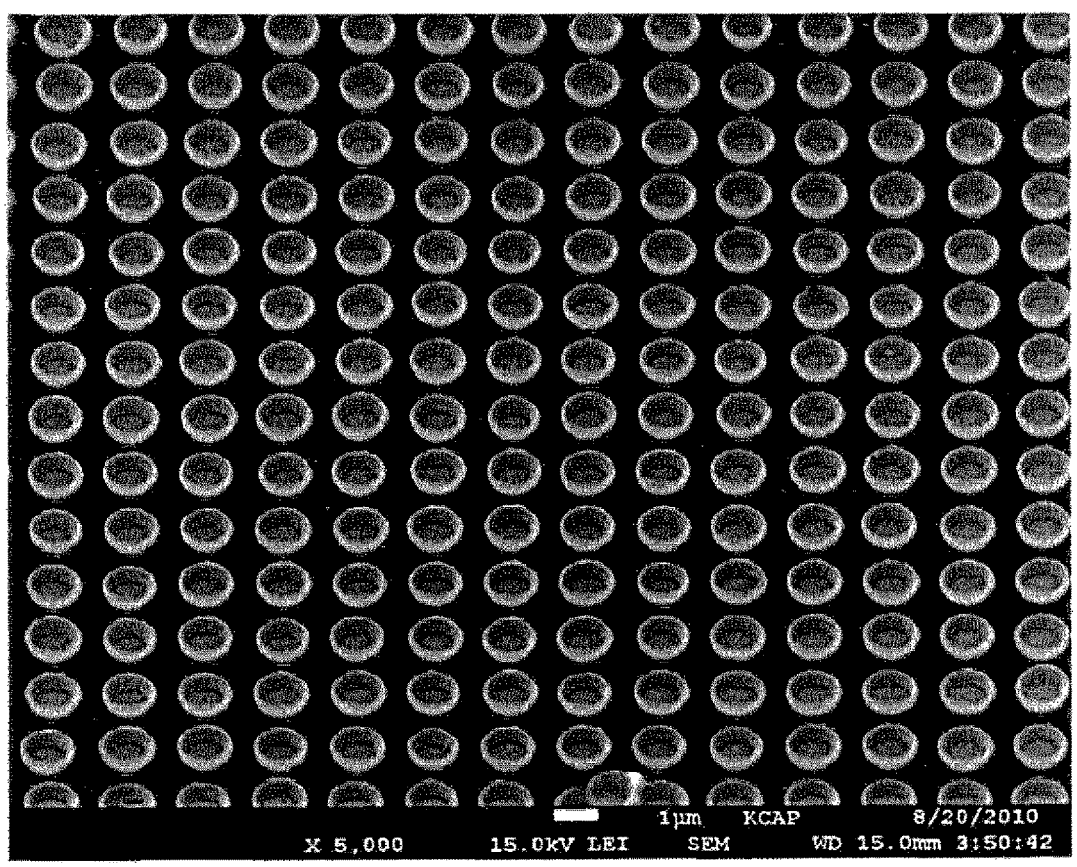
Figure 7D:
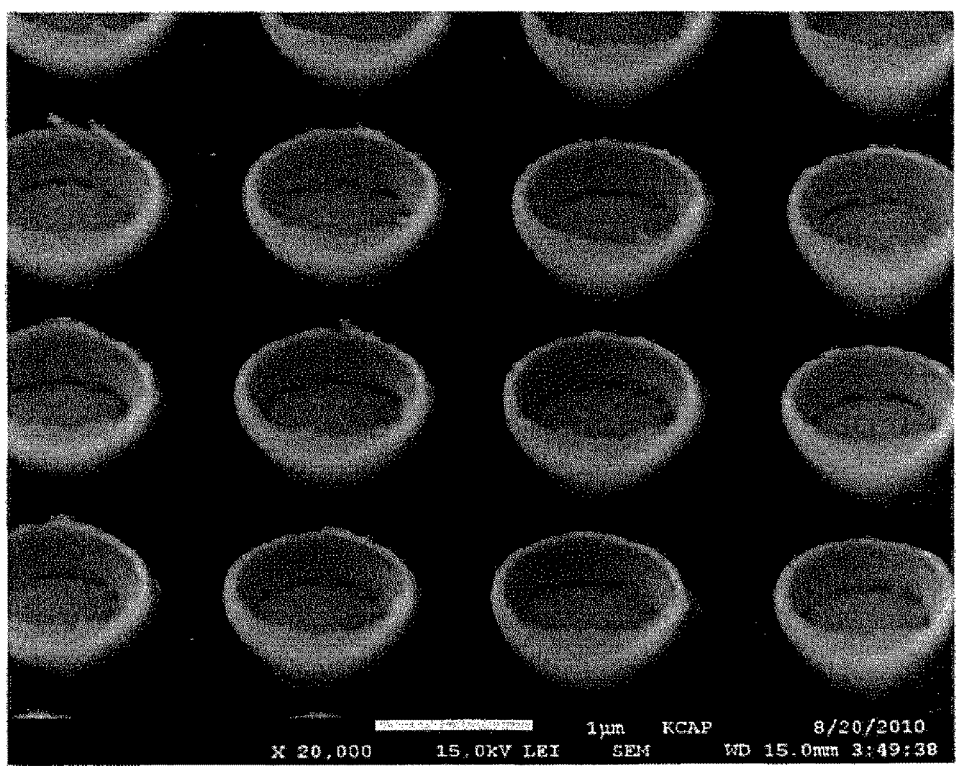
Figure 8A:
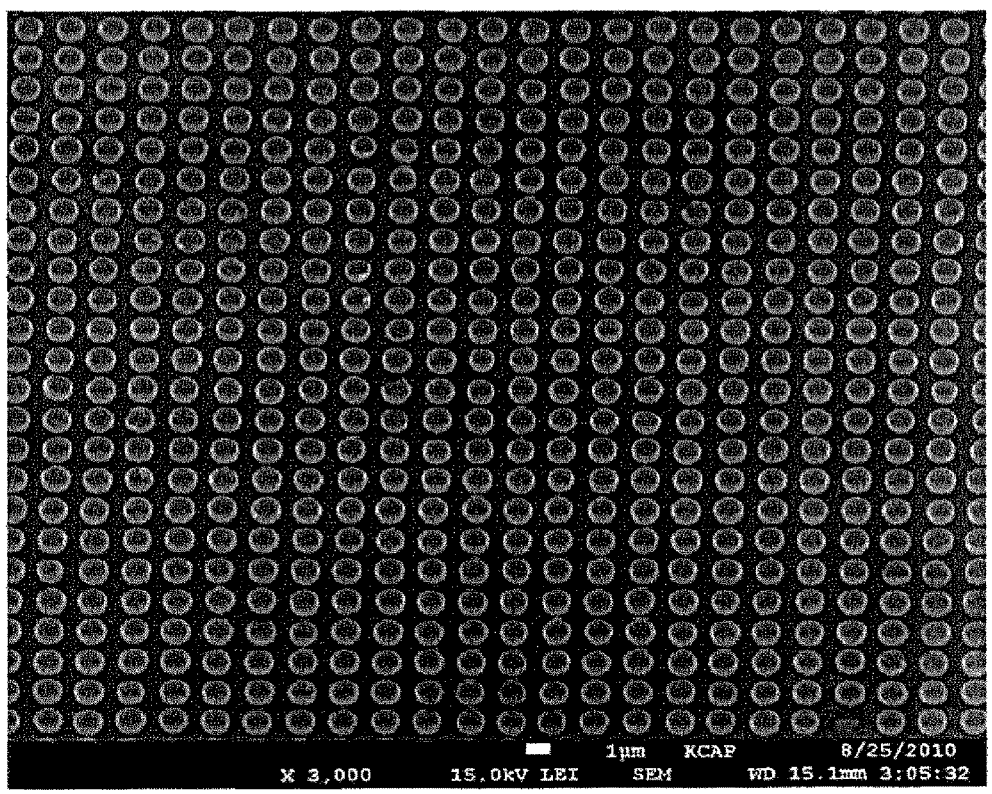
FIG. 8 is a photograph of a GaP bowl array observed by using a transmission electrode microscope (TEM) in accordance with an example of the present disclosure.
Figure 8B:
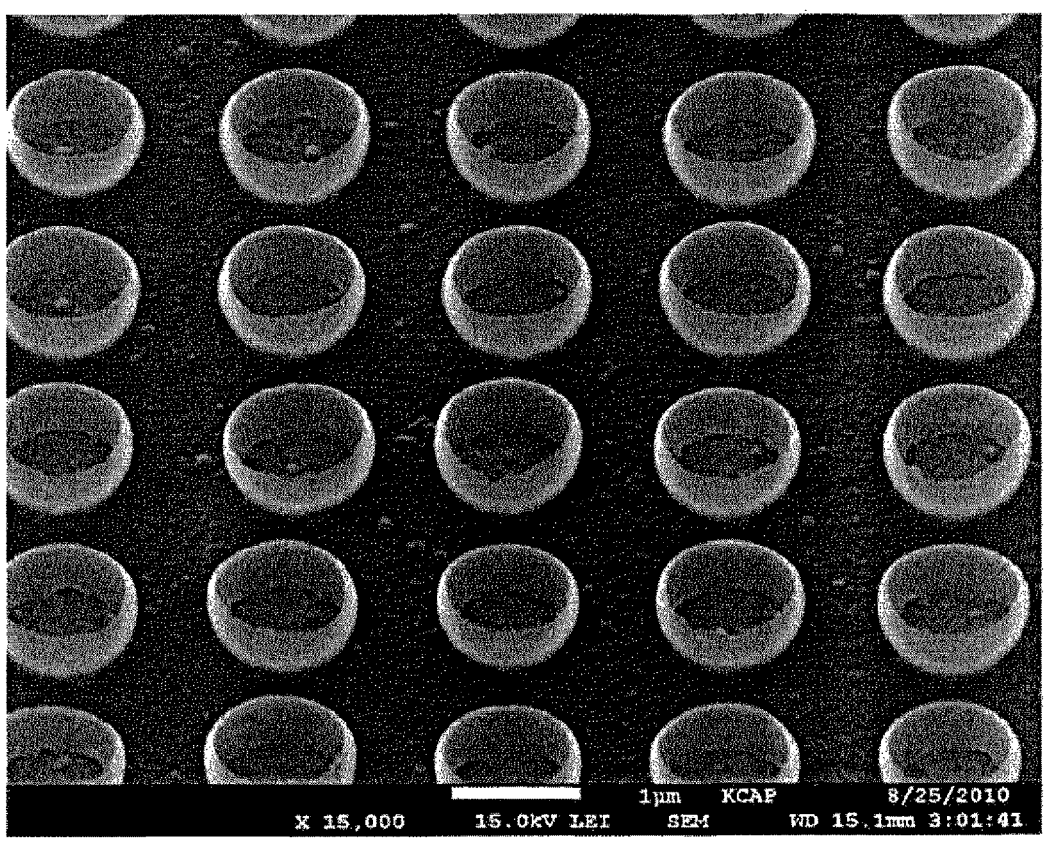
Figure 9A:
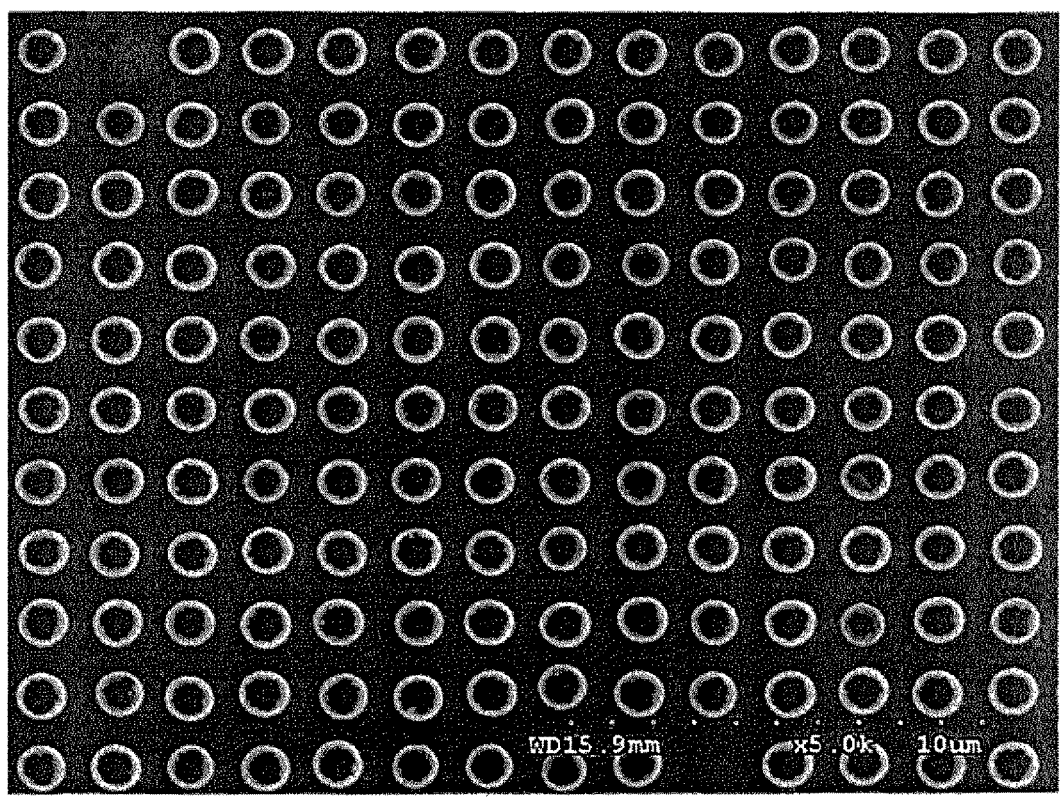
FIG. 9 is a photograph of an Au bowl array observed by using a transmission electrode microscope (TEM) in accordance with an example of the present disclosure.
Figure 9B:
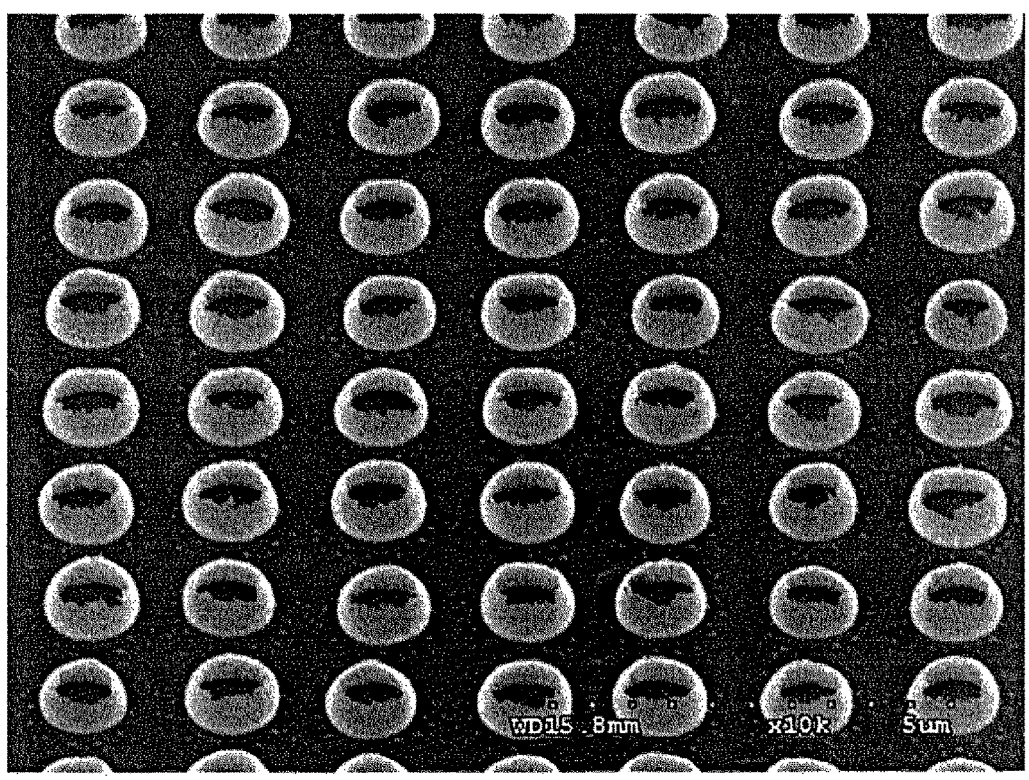
Figure 9C:
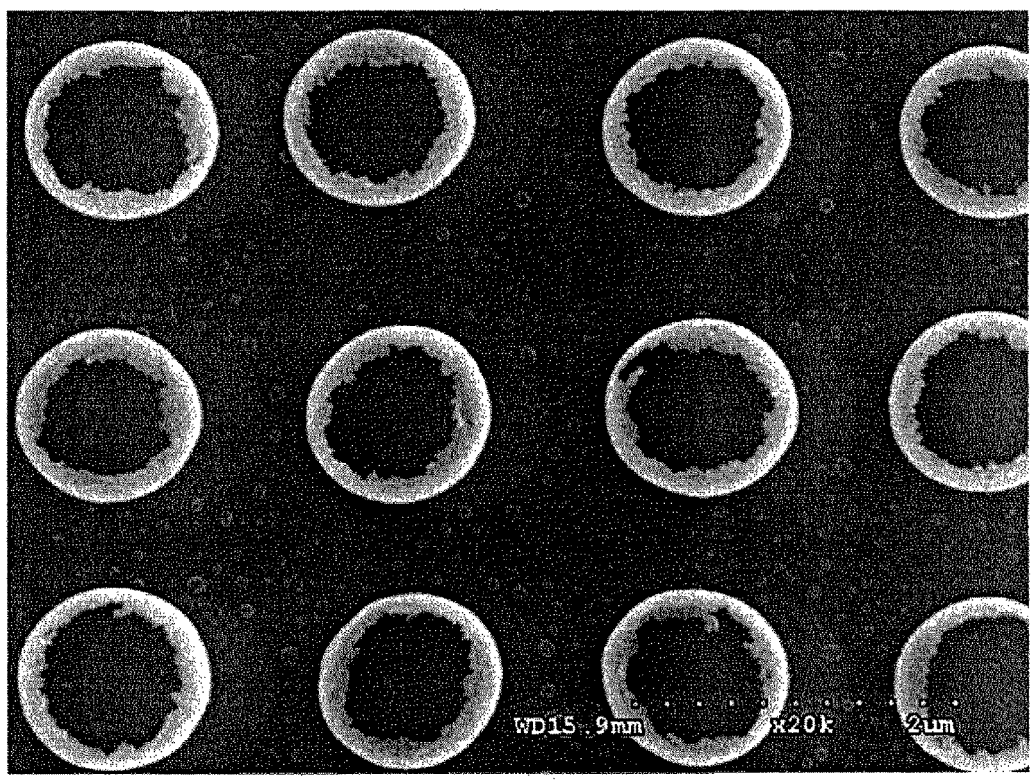
Figure 9D:
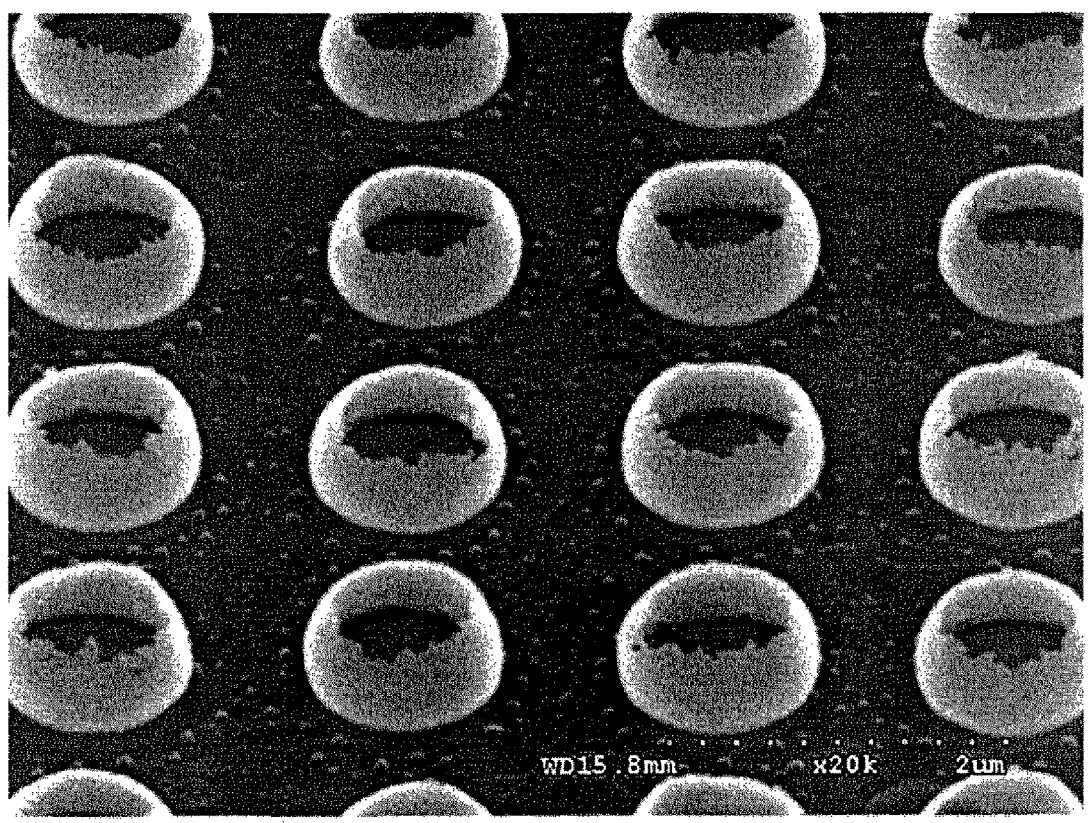
Figure 10A:
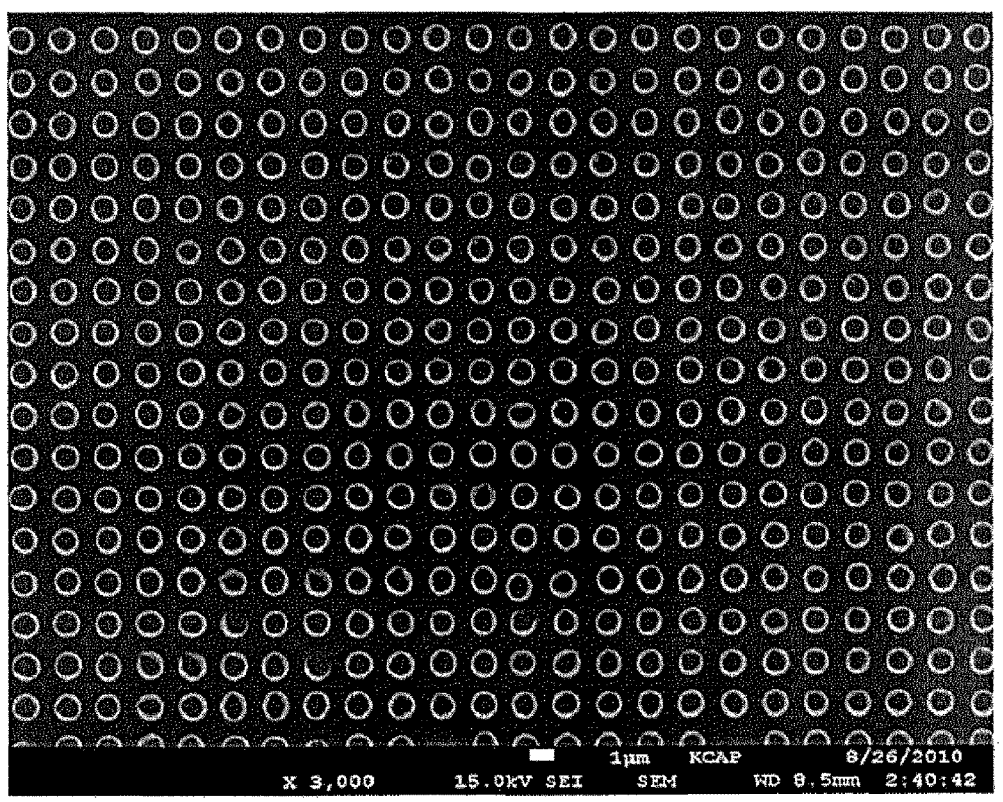
FIG. 10 is a photograph of a Pt bowl array observed by using a transmission electrode microscope (TEM) in accordance with an example of the present disclosure.
Figure 10B:
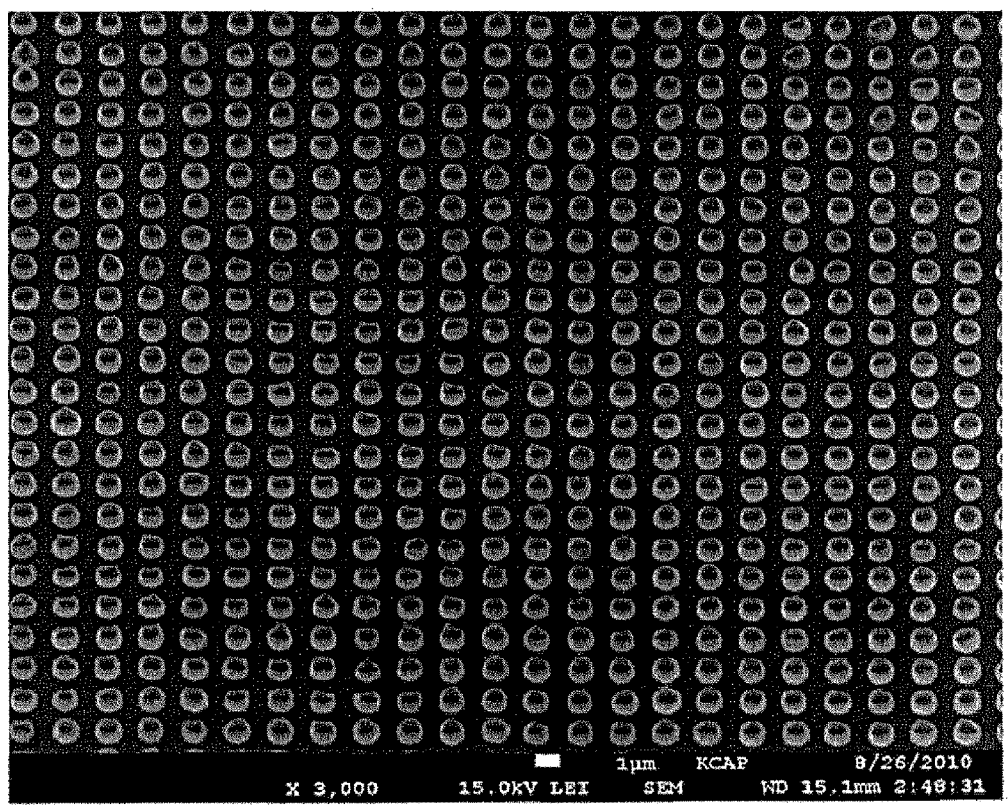
Figure 10C:
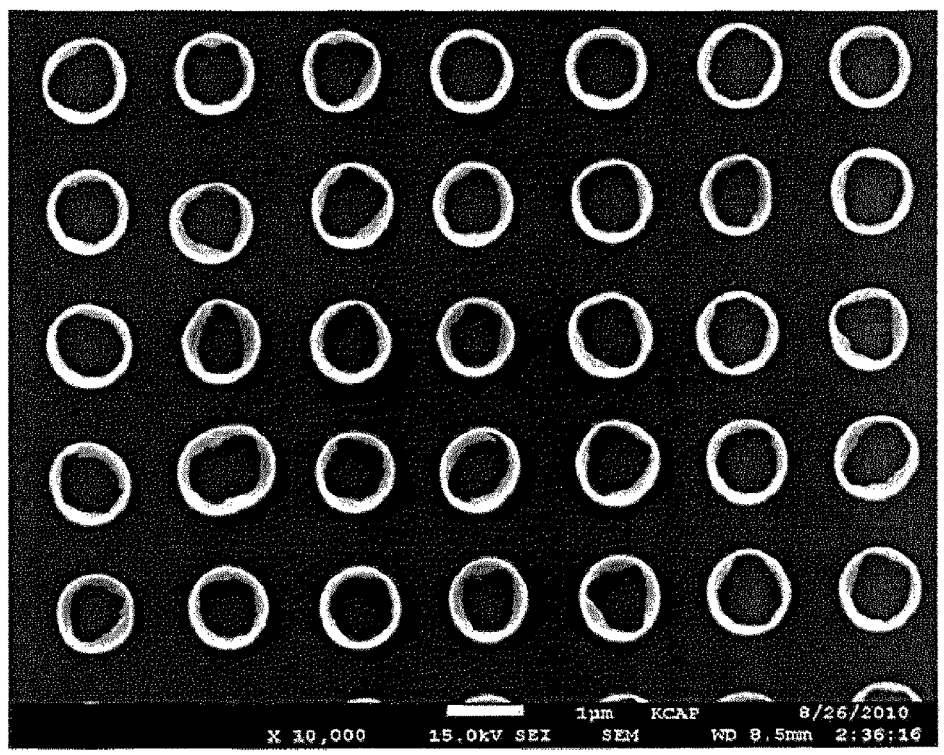
Figure 10D:
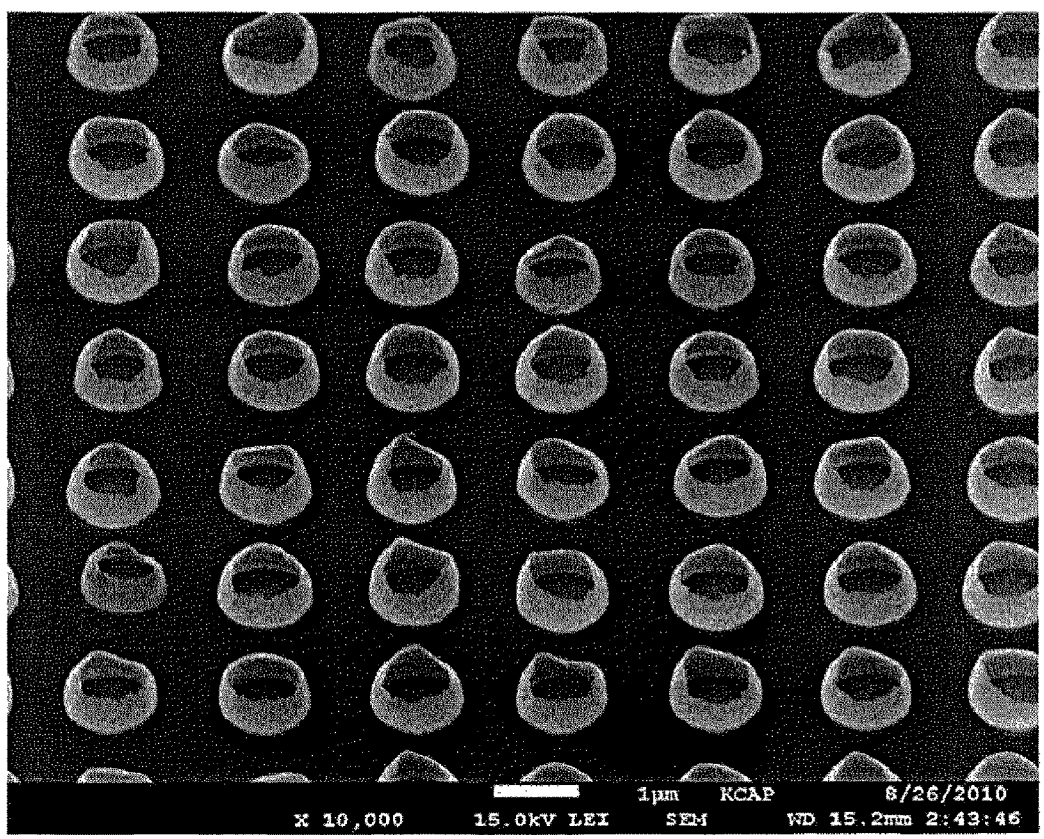
Figure 11A:
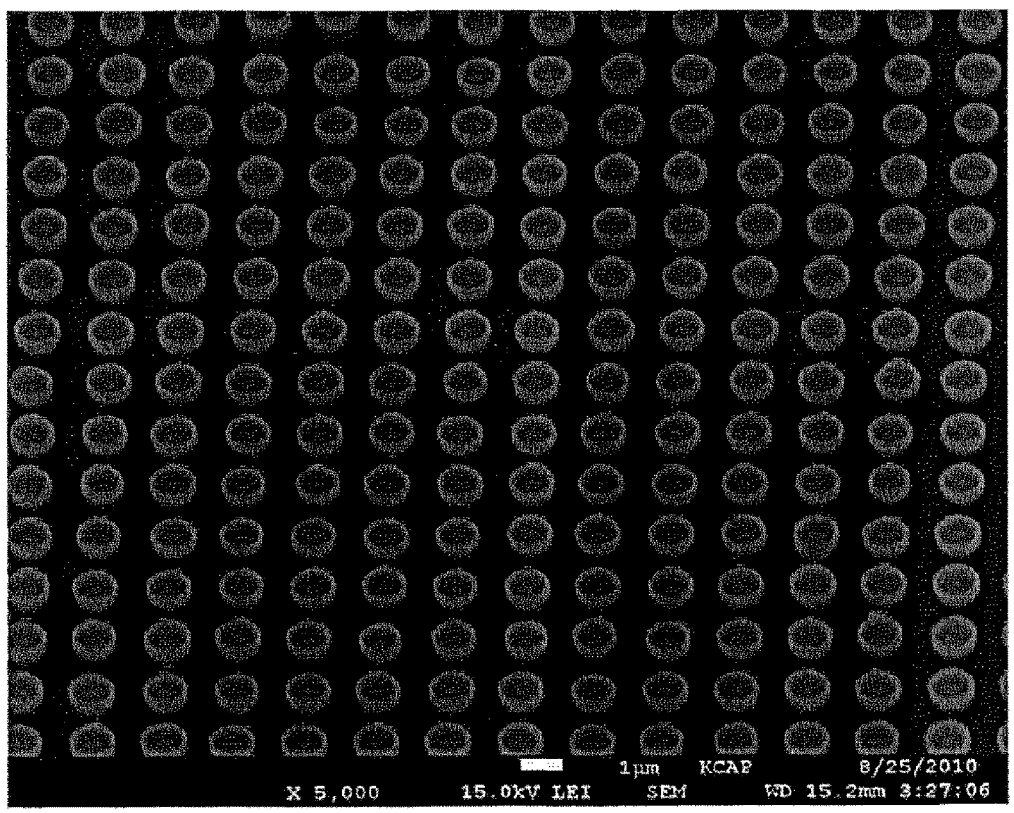
FIG. 11 is a photograph of a Cu bowl array observed by using a transmission electrode microscope (TEM) in accordance with an example of the present disclosure.
Figure 11B:
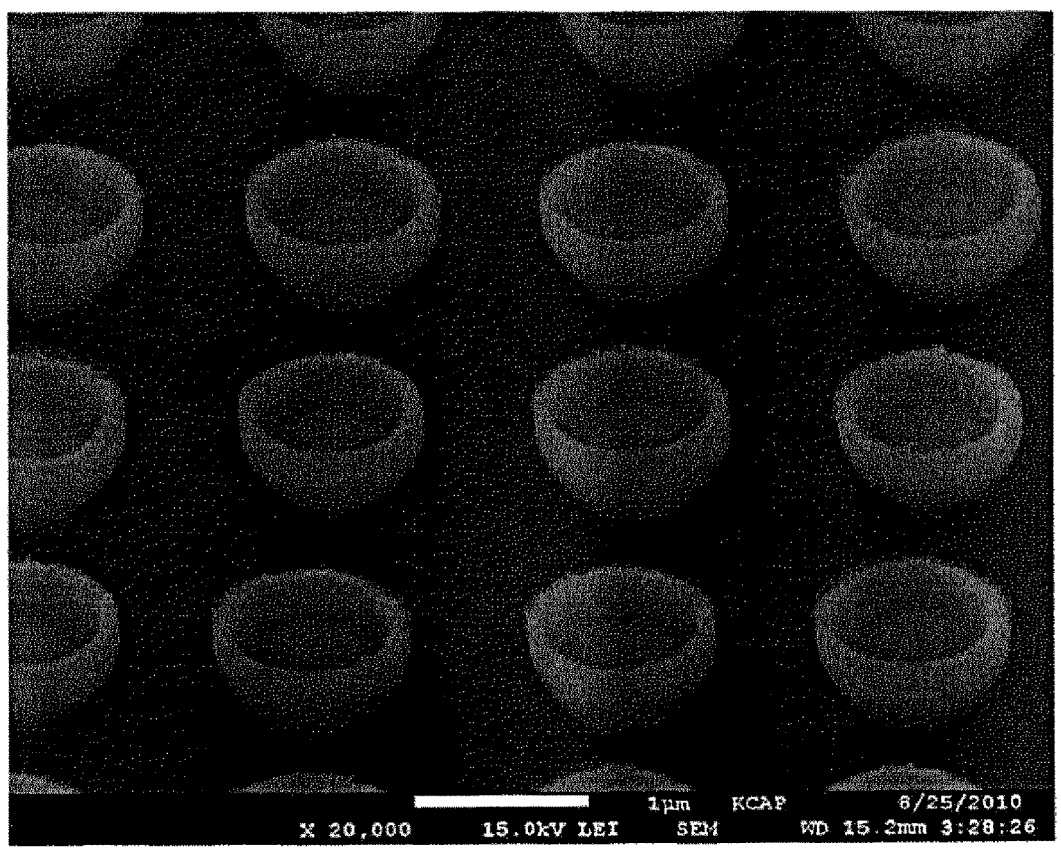

Thereafter, the alignment layer of the particles 30 on the first substrate 10 is transferred onto a second substrate 20 (S2). As shown in FIG. 3, an adhesive layer 21 may be further formed on the second substrate, if necessary. Non-limiting examples for an adhesive material forming the adhesive layer may include polystyrene, polyethylene imine (PEI), polyacrylamide (PAM), poly-DADMAC (diallyldimethyl ammonium chloride), polyethylene oxide (PEO) or a combination thereof, but it may not be limited thereto. A proper adhesive resin known in the art of the present disclosure may be selected and used.

If the adhesive layer is formed on the second substrate, the transfer of the alignment layer of the particles may be performed in the manner that the alignment layer of the particles on the first substrate is contacted with the second substrate, on which the adhesive layer is formed, such that the alignment layer of the particles is transferred onto the second substrate due to the adhesion of the adhesive material. However, the present disclosure may not be limited thereto. The adhesive material enables the particles to be more easily adhered onto the first or second substrate.

Subsequently, the alignment layer of the particles 30 on the second substrate 20 is coated with a thin film-forming material 40 to form a particles-thin film composite 50 (S3). In order to prepare the composite, all the particles may be coated with the thin film-forming material. However, the present disclosure may not be limited thereto. If necessary, only parts of the particles may be coated with the thin film-forming material. For the coating method, any coating method generally used in the art of the present disclosure may be used without limitation. For example, the composite may be formed by dip coating or spin coating with the thin film-forming material 40, but it may not be limited thereto. A thin film formed by the thin film-forming material may include one selected from the group consisting of an organic thin film, an inorganic thin film, an organic-inorganic hybrid thin film and combinations thereof. For example, the organic thin film may include at least one selected from the group consisting of polystyrene, polymethylmethacrylate (PMMA), polyacrylate, polyalphamethylstyrene, polybenzylmethacrylate, polyphenylmethacrylate, polydiphenylmethacrylate, polycyclohexylmethacrylate, a styrene-acrylonitrile copolymer and a styrene-methylmethacrylate copolymer, but may not be limited thereto. For example, the inorganic thin film may include a metal, an inorganic oxide or other various inorganic materials, but it may not be limited thereto.

After the formation of the composite 50, only the particles 30 are selectively removed from the composite to form a template 60 including holes (S4). The method of forming the template may include removing a portion of the thin film-forming material that forms the composite from the composite through etching to expose the particles and removing the exposed particles. However, the present disclosure may not be limited thereto. In addition, the method of etching the thin film is an etching method generally used in the art of the present disclosure and may include dry or wet etching. For example, the thin film can be etched by using an etching solution capable of selectively removing the thin film or through plasma etching (e.g., $O_2$ plasma etching). For the method of removing the particles, any method capable of selectively removing only the particles can be used without limitation. For example, the particles can be removed by using an acid solution through wet etching, but it may not be limited thereto. The above-described method of forming the template including holes can be performed as described in Korean Patent Application No. 10-2010-0080868, the entire disclosures of which are incorporated herein by reference.

If necessary, the present disclosure may further include transferring the template onto another substrate after forming the template including holes (S4) and prior to coating the surface of the template 60 with a first material 70 (S5). For example, the substrate may be a porous substrate, and holes of the porous substrate may be equal to or larger than the holes of the template. However, the present disclosure may not be limited thereto. In addition, as described above, if the adhesive layer is formed on the second substrate, the adhesive layer may be removed prior to transferring the template onto the substrate in order to facilitate the transfer of the template (refer to FIG. 3).

Subsequently, the surface of the template 60 is coated with the first material 70 (S5). The first material may include one selected from the group consisting of a metal, a semiconductor, a metal oxide, an alloy and combinations thereof, but it may not be limited thereto. In addition, for the above-mentioned metal, semiconductor, metal oxide, alloy, etc., materials generally used in the art of the present disclosure can be used without limitation. For example, Au, Cu, Pt, Cr, or Ag may be used for the metal, CdS, CdSe or ZnS can be used for the semiconductor, and $TiO_2$, ZnO, $Fe_2O_3$, NiO, $WO_3$ or others can be used for the metal oxide. However, the present disclosure may not be limited thereto. If necessary, an additional coating process using a second material may be performed after the coating with the first material. The second material may be the same as or different from the first material. That is, the first and second materials may have different properties. For example, one bowl-typed structure may be coated with a material having an oxidation function and a material having a reduction function as the first and second materials, respectively, so as to prepare a structure having oxidation function and reduction function.

For the method of coating with the first and second materials, any method generally used in the art of the present disclosure can be used without limitation. For example, the coating may be performed by sputtering, thermal evaporation, pulsed laser deposition (PLD), atomic layer deposition (ALD), ion-assisted deposition (IAD), or self-assembly, but it may not be limited thereto.

Finally, only the template 60 is selectively removed from the template coated with the first and/or second materials to form a bowl-typed structure 80 (S6). The method of selectively removing the template may be a method generally used in the art of the present disclosure and may include dry or wet etching. For example, the template can be selectively removed through plasma etching (e.g., $O_2$ plasma etching), which is the dry etching method, to prepare a bowl-typed structure including the first and/or second materials. In addition, all the above descriptions of the method of etching the thin film can be included. For convenience, overlapping descriptions in this regard are omitted.

FIGS. 5 to 11 are photographs of a bowl array, which is formed by using various materials in accordance with examples of the present disclosures, as observed by a transmission electrode microscope (TEM). With reference to FIGS. 5 to 11, it is identified that the bowl-typed structure formed by the above-described method is regularly formed with a constant interval. With reference to the same figures, it is identified that for the shape of the "bowl-typed structure" of the present structures, any structure, which can be formed by forming the coating material on the surface of the template including holes and removing the template, can be used without limitation. For example, the "bowl-typed structure" may include a lower portion, an outer peripheral portion extending upward and outward in a straight and/or arc shape from the lower portion, and an opening upper portion formed by the outer peripheral portion, but it may not be limited thereto.

The structure and the shape of the bowl-typed structure are determined depending on a shape of the holes of the template, and the holes of the template vary depending on a shape of the particles. Accordingly, the structure and/or the shape of the bowl-typed structure may vary depending on a shape of the particles. For example, FIGS. 5 to 11 formed a template including spherical holes by using particles in an almost spherical shape and prepared a bowl array by using the template. However, the shape of the particles may not be limited thereto. As non-limiting examples for the particles, the particles may be in a symmetric, asymmetric or amorphous shape. Non-limiting shapes of the particles may include a spherical shape, a hemispherical shape, a cube shape, a tetrahedral shape, a pentahedral shape, a hexahedral shape, a rectangular parallelepiped shape, an octahedral shape, a Y shape, a column shape, a conical shape, etc., but it may not be limited thereto. In addition, the particles may be particles in a continuously curved shape having no a flat facet, preferably, a spherical shape.

In addition, a size of the bowl-typed structure varies depending on a size of the holes of the template, and more specifically, a size of the particles. A size of the particles may be from about 10 nm to about 100 μm, or from about 10 nm to about 10 μm. Accordingly, the holes of the template and the bowl-typed structure may also have the size of from about 10 nm to about 100 μm, or from about 10 nm to about 10 μm, but it may not be limited thereto.

In an illustrative embodiment, a size of the particles may be from about 10 nm to about 100 μm, but it may not be limited thereto. A size of the particles may be in a nanometer to micrometer range. For example, a size of the particles may be from about 10 nm to about 100 μm, or from about 10 nm to about 50 μm, or from about 10 nm to about 10 μm, or from about 10 nm to about 1 μm, or from about 50 nm to about 100 μm, or from about 100 nm to about 100 μm, or from about 1 μm to 100 μm, but it may not be limited thereto.

In an illustrative embodiment, a thickness of the coating layer formed by the coating with the first material may be from about 1 nm to about 10 μm, but it may not be limited thereto. For example, a thickness of the coating layer may be from about 1 nm to about 10 μm, or from about 1 nm to about 1 μm, or from about 1 nm to about 500 nm, or from about 1 nm to about 300 nm, or from about 1 nm to about 200 nm, or from 1 nm to about 100 nm, or from about 5 nm to about 10 μm, or from about 5 nm to about 1 μm, or from about 5 nm to about 500 nm, or from 5 nm to about 300 nm, or from about 5 nm to about 200 nm, from about 5 nm to about 100 nm, or from about 50 nm to about 10 μm, or from about 50 nm to about 1 μm, or from about 50 nm to about 500 nm, or from about 50 nm to about 300 nm, or from about 50 nm to about 200 nm, but it may not be limited thereto.

As described above, the present disclosure can prepare a highly regularly aligned bowl array through the simple process of forming a template including holes by rubbing particles in various sizes, coating the template including holes with various materials, and then, removing the template.

Hereinafter, the present disclosure will be described in detail with reference to examples, but it may not be limited to the examples.

EXAMPLE

For the first substrate, a patterned polydimethylsiloxane (PDMS) substrate (pitch 700 nm) was used. For the particles, $SiO_2$ beads (650 nm) in a uniform size were used. The $SiO_2$ beads (650 nm) in the uniform size were aligned on the first substrate through a rubbing method to form a $SiO_2$ bead monolayer.

For the second substrate, a glass substrate was used. After the second substrate was coated with 0.6 wt % polyethyleneimide (PET), which is the adhesive material, through spin coating (3000 rpm, 20 seconds), the $SiO_2$ bead monolayer was transferred onto the glass substrate. Thereafter, PMMA (2 g, molecular weight: 996,000), which is the thin film-forming material, was added to toluene (50 g) and stirred at 60° C. The PMMA was completely dissolved so that a 4% PMMA solution was prepared. The solution was cooled to be a room temperature, and then, the $SiO_2$ bead monolayer on the glass substrate was immersed in the solution for 15 minutes. Thereafter, the $SiO_2$ bead monolayer on the glass substrate was taken out of the solution and subject to spin coating at a speed of 3000 rpm for 20 seconds so that the $SiO_2$ bead monolayer was coated with the PMMA, and a $SiO_2$ bead-PMMA thin film composite was formed.

The $SiO_2$ bead-PMMA thin film composite formed on the glass substrate through the above-described process was immersed in second distilled water for 20 minutes to separate the $SiO_2$ bead-PMMA thin film composite and the glass substrate. The $SiO_2$ bead-PMMA thin film composite was transferred onto a silicon wafer.

After the $SiO_2$ bead-PMMA thin film composite on the silicon wafer was heated in an oven of 140° C. for one hour, a portion of an upper PMMA thin film of the $SiO_2$ bead-PMMA thin film composite was etched by using an $O_2$ plasma cleaner (HARRICK) for 5 minutes to be removed. After the etching, the $SiO_2$ bead-PMMA thin film composite was placed in a 5% HF solution for 4 seconds to remove the $SiO_2$ beads. Thereafter, the composite was washed with second distilled water, and then, dried so as to form a PMMA template including holes.

Subsequently, a first material was formed on the PMMA template including holes. More specifically, the PMMA template including holes was placed on a rotatable target substrate with a diameter of from 5 cm to about 10 cm, and $WO_3$, which is the first material, was deposited on the PMMA template including holes through a magnetron sputtering system. The lowest pressure was maintained at $5.0 \times 10^{-7}$ torr or less. For a carrier gas, a 99.999% pure Ar gas was used. A flow rate of the Ar gas was maintained at about 30 sccm to about 50 sccm. The substrate was maintained to have a room temperature during the deposition process. A thickness of the $WO_3$ coating layer formed by the sputtering was from about 100 nm to about 150 nm. After the sufficient coating of the PMMA template including holes with $WO_3$, the thin film was immersed in toluene (50 g) for about 12 hours to selectively remove only the PMMA template. Thereafter, the thin film was dried with an $N_2$ gas so that a $WO_3$ bowl array (FIG. 5) was prepared.

Through the same process as described above, each of CdS, $BiVO_4$, GaP, Au, Pt and Cu was deposited by sputtering on the PMMA template including holes to have a thickness of from about 100 nm to about 150 nm so that a CdS bowl array (FIG. 6), a $BiVO_4$ bowl array (FIG. 7), a GaP bowl array (FIG. 8), an Au bowl array (FIG. 9), a Pt bowl array (FIG. 10), and a Cu bowl array (FIG. 11) were prepared, respectively.

The present disclosure has been described with reference to preferred illustrative embodiments and examples. However, it can be understood by one of ordinary skill in the art of the present disclosure that the present disclosure can be changed and modified in various ways within the technical concept and scope described in the claims of the present disclosure.

What is claimed is:

1. A preparing method of bowl-typed structures, comprising:
    forming an alignment layer of particles on a first substrate by applying physical pressure on the particles, so that the particles align with a regularly spaced distance from each other;
    contacting the alignment layer of particles formed on the first substrate with a second substrate having an adhesive layer formed thereon to transfer the alignment layer of the particles aligned with a regularly spaced distance from each other to the second substrate by adhesion of the adhesive layer;
    coating the alignment layer of the particles transferred onto the second substrate having the adhesive layer with a film-forming material so as to fill a space defining the regularly spaced distance between the particles to form a particle film composite;
    removing the entire adhesive layer and a portion of the film-forming material from the particle film composite to expose the particles and then removing the exposed particles to form a template including holes that are separated by the regularly spaced distance; and
    coating the surface of the holes of the template with a first material and then removing the template to form the bowl-typed structures that are separated by the regularly spaced distance.

2. The preparing method of bowl-typed structures of claim 1,
    wherein the first material includes a member selected from the group consisting of a metal, a semiconductor, a metal oxide, an alloy, and combinations thereof.

3. The preparing method of bowl-typed structures of claim 1,
    wherein the coating of the surface of the holes of the template with the first material is performed by sputtering, thermal evaporation, pulsed laser deposition, atomic layer deposition, ion-assisted deposition, or self-assembly.

4. The preparing method of bowl-typed structures of claim 1, further including:
    coating a second material once or more on the first material coated to the surface of the holes.

5. The preparing method of bowl-typed structures of claim 4,
    wherein the second material includes a member selected from the group consisting of a metal, a semiconductor, a metal oxide, an alloy, and combinations thereof.

6. The preparing method of bowl-typed structures of claim 1,
    wherein the first substrate includes a first intaglio pattern or a first embossed pattern.

7. The preparing method of bowl-typed structures of claim 1,
    wherein the template has a porous film structure including regularly aligned holes.

8. The preparing method of bowl-typed structures of claim 1,
    wherein a size of the particles is from 10 nm to 100 µm.

9. The preparing method of bowl-typed structures of claim 1,
    wherein a thickness of a coating layer formed by the coating with the first material is from 1 nm to 10 µm.

10. The preparing method of bowl-typed structures of claim 1,
    wherein the physical pressure is applied by rubbing or pressing against the substrate.

11. The preparing method of bowl-typed structures of claim 1,
    wherein the particles include a member selected from an organic polymer, an inorganic polymer, an inorganic compound, a metal, a magnetic substance, a semiconductor, a biomaterial, and combinations thereof.

12. The preparing method of bowl-typed structures of claim 1,
    wherein an aspect ratio which represents the ratio of a diameter and a depth of the bowl-typed structures is from 0.1 to 10.

13. The preparing method of bowl-typed structures of claim 1,
    wherein the plurality of the bowl-typed structures are regularly aligned with a constant interval.

14. The preparing method of bowl-typed structures of claim 1, further including:
    transferring the formed bowl-typed structures onto a porous substrate.

* * * * *